(12) United States Patent  (10) Patent No.: US 12,083,553 B2
Miyakubo  (45) Date of Patent: Sep. 10, 2024

(54) SUBSTRATE PROCESSING METHOD, RECORDING MEDIUM, AND SUBSTRATE PROCESSING APPARATUS

(71) Applicant: Tokyo Electron Limited, Tokyo (JP)

(72) Inventor: Yusuke Miyakubo, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 2 days.

(21) Appl. No.: 17/662,867

(22) Filed: May 11, 2022

(65) Prior Publication Data
US 2022/0371048 A1  Nov. 24, 2022

(30) Foreign Application Priority Data
May 12, 2021 (JP) .................................. 2021-081106

(51) Int. Cl.
B05D 1/02 (2006.01)
B05B 12/02 (2006.01)
B05D 1/32 (2006.01)

(52) U.S. Cl.
CPC .............. B05D 1/02 (2013.01); B05B 12/02 (2013.01); B05D 1/32 (2013.01)

(58) Field of Classification Search
None
See application file for complete search history.

(56) References Cited

U.S. PATENT DOCUMENTS

2015/0036109 A1* 2/2015 Yoshihara ............... B05C 5/027
  430/434
2018/0019112 A1* 1/2018 Kai .................. H01L 21/31144

FOREIGN PATENT DOCUMENTS

JP  2003-257849 A  9/2003

* cited by examiner

Primary Examiner — Michael P. Rodriguez
(74) Attorney, Agent, or Firm — Pearne & Gordon LLP

(57) ABSTRACT

A substrate processing method includes performing a developing processing on a substrate. The developing processing includes supplying a developing liquid on a surface of the substrate to form a liquid film of the developing liquid on the surface of the substrate; maintaining the liquid film on the surface such that development progresses; and performing, during the maintaining of the liquid film, a first processing of supplying a gas to an inner region located inward of a peripheral region on the surface of the substrate and a second processing of supplying an adjusting liquid configured to suppress progress of the development on the peripheral region to adjust a degree of the development between the peripheral region and the inner region. The second processing is started after a start time of the first processing, and the second processing is ended after an end time of the first processing.

9 Claims, 20 Drawing Sheets

FIG. 7

| No. | UNIT PROCESSING | PROCESSING TIME |
|---|---|---|
| 1 | SUPPLY OF DEVELOPING LIQUID L1 | t1 |
| 2 | DEVELOPMENT (STANDBY) | t2 |
| 3 | SUPPLY OF GAS G | t3 |
| 4 | DEVELOPMENT (STANDBY) | t4 |
| 5 | SUPPLY OF ADJUSTING LIQUID L2 | t5 |
| 6 | DEVELOPMENT (STANDBY) | t6 |
| 7 | RINSING PROCESSING | t7 |

| REPETITION NUMBER | FIRST PARAMETER ($p1_k$) | SECOND PARAMETER ($p2_k$) | MEASUREMENT DATA |
|---|---|---|---|
| 1 | 0 | 30 |  |
| 2 | 10 | 30 |  |
| 3 | 15 | 40 |  |
| ⋮ | ⋮ | ⋮ | ⋮ |
| N | 20 | 90 |  |

SUBSTRATE PROCESSING METHOD, RECORDING MEDIUM, AND SUBSTRATE PROCESSING APPARATUS

CROSS-REFERENCE TO RELATED APPLICATION

This application claims the benefit of Japanese Patent Application No. 2021-081106 filed on May 12, 2021, the entire disclosure of which is incorporated herein by reference.

TECHNICAL FIELD

The various aspects and embodiments described herein pertain generally to a substrate processing method, a recording medium, and a substrate processing apparatus.

BACKGROUND

Patent Document 1 describes a developing apparatus for a substrate, which is equipped with a substrate holding device, a developing liquid supply device, and a rinse liquid supply device. The rinse liquid supply device of this developing apparatus discharges a rinse liquid onto the substrate from a slit-shaped discharge opening while being moved in a horizontal direction to thereby stop a developing reaction by the developing liquid.

Patent Document 1: Japanese Patent Laid-open Publication No. 2003-257849

SUMMARY

In one exemplary embodiment, a substrate processing method includes performing a developing processing on a substrate. The developing processing includes supplying a developing liquid on a surface of the substrate to form a liquid film of the developing liquid on the surface of the substrate; maintaining the liquid film of the developing liquid on the surface of the substrate such that development progresses on the surface of the substrate; and performing, during the maintaining of the liquid film of the developing liquid on the surface of the substrate, a first processing of supplying a gas to an inner region located at an inner side than a peripheral region on the surface of the substrate and a second processing of supplying an adjusting liquid configured to suppress progress of the development on the peripheral region to adjust a degree of the development between the peripheral region and the inner region. The second processing is started after a start time of the first processing, and the second processing is ended after an end time of the first processing.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 7 is a diagram illustrating an example of a processing recipe of a developing processing;

DETAILED DESCRIPTION

Figure 1:
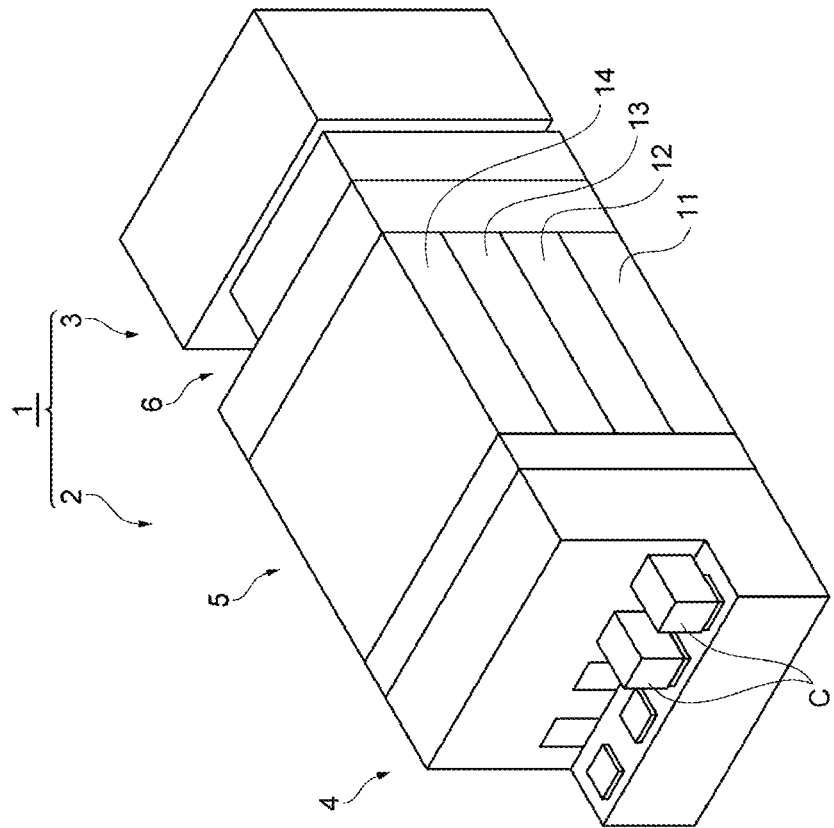
FIG. 1 is a schematic diagram illustrating an example of a substrate processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Outline of exemplary embodiments will be described.

In one exemplary embodiment, a substrate processing method includes performing a developing processing on a substrate. The developing processing includes supplying a developing liquid on a surface of the substrate to form a liquid film of the developing liquid on the surface of the substrate; maintaining the liquid film of the developing liquid on the surface of the substrate such that development progresses on the surface of the substrate; and performing, during the maintaining of the liquid film of the developing liquid on the surface of the substrate, a first processing of supplying a gas to an inner region located at an inner side than a peripheral region on the surface of the substrate and a second processing of supplying an adjusting liquid configured to suppress progress of the development on the peripheral region to adjust a degree of the development between the peripheral region and the inner region. The second processing is started after a start time of the first processing, and the second processing is ended after an end time of the first processing.

By supplying the gas, the temperature of the liquid film of the developing liquid can be lowered to thereby accelerate the development, and by supplying the adjusting liquid after the supply of the gas, the progress of the development can be suppressed. Thus, in the above substrate processing method, the degree of the development can be adjusted between the inner region and the peripheral region by supplying the gas and the adjusting liquid. Since the line width after the development varies according to the degree of the development, it becomes possible to easily adjust the line width distribution within the surface of the substrate in the above-described substrate processing method.

In the substrate processing method, the second processing may be started after the end time of the first processing. The maintaining of the liquid film of the developing liquid on the surface of the substrate may include carrying on the maintaining of the liquid film of the developing liquid on the surface of the substrate between the end time of the first processing and a start time of the second processing. In this case, the period during which the gas is supplied to the inner region and the period during which the adjusting liquid is supplied to the peripheral region do not overlap with each other. Thus, the influence from one of the first and second processings to the other can be suppressed, so that the line width distribution can be more easily adjusted.

The substrate processing method may further include adjusting, before the performing of the developing processing on the substrate, the first parameter regarding the condition of the first processing and the second parameter regarding the condition of the second processing. The performing of the first processing and the second processing in the developing processing may include performing the first processing according to an adjusted first parameter and performing the second processing according to an adjusted second parameter. The supply of the gas in the first processing affects the line width in the inner region, and the supply of the adjusting liquid in the second processing affects the line width in the peripheral region. Thus, the line width distribution after development is changed by adjusting the parameters related to the conditions of the first processing and the second processing. Therefore, in the above-described method, by adjusting the parameters, it becomes possible to easily make the line width distribution approach the target distribution.

The substrate processing method may further include generating, before the adjusting of the first parameter and the second parameter, estimation information in which a line width distribution on the surface of the substrate after being subjected to the development is predicted. The generating of the estimation information may include acquiring information indicating multiple test conditions in which at least one of the first parameter or the second parameter has different values; performing a test developing processing corresponding to the developing processing on a test substrate for each of the multiple test conditions; acquiring, for each of the multiple test conditions, measurement data of the line width distribution on a surface of the test substrate after being subjected to the development; and generating, for each of multiple positions on the surface of the test substrate, a regression equation indicating a relationship between the first parameter and the second parameter and a line width based on the measurement data. The adjusting of the first parameter and the second parameter may include calculating, based on the regression equation, a set value of the first parameter and a set value of the second parameter at a time of performing the developing processing such that the line width distribution on the surface of the substrate after being subjected to the development satisfies a predetermined condition. In this case, by using the estimation information, it is possible to quantitatively evaluate the influence of the change in the condition of each of the first processing and the second processing on the line width distribution. Thus, it becomes possible to adjust the processing conditions such that the line width distribution satisfies the predetermined condition without course to the trials and errors by the operator or the experience of the operator.

The calculating of the set value of the first parameter and the set value of the second parameter based on the regression equation may include calculating, based on the regression equation, prediction data of the line width distribution after the development for each combination of multiple stages when changing each of the first parameter and the second parameter in the multiple stages; and acquiring, in the prediction data, a value of the first parameter and a value of the second parameter in a combination, in which a highest uniformity of the line width distribution is obtained, as the set value of the first parameter and the set value of the second parameter. In this case, as the developing processing is performed after each of the first parameter and the second parameter is set to the calculated set values, it is possible to obtain a line width distribution with improved in-plane uniformity. Thus, the above-described method enables to easily improve the uniformity of the line width distribution within the surface of the substrate.

The generating of the regression equation may include generating the regression equation by performing ridge regression analysis based on the measurement data and respective values of the first parameter and the second parameter under which the measurement data is obtained. By performing the ridge regression analysis, overlearning can be alleviated even when the number of the measurement data is small. Thus, the method enables to achieve both the improvement of prediction accuracy and shortening of the adjustment of processing conditions.

The developing processing may include supplying a rinse liquid on the surface of the substrate after the maintaining of the liquid film of the developing liquid. The adjusting of the first parameter and the second parameter may include adjusting the first parameter and the second parameter without changing a condition that determines a period of time ranging from a start time of the supplying of the developing liquid to a start time of the supplying of the rinse liquid. In this case, the line width distribution can be adjusted without changing the processing time of the developing processing. Thus, it becomes possible to adjust the line width distribution without changing a throughput.

The first parameter may be a processing time of the first processing. It is found out that there is a strong correlation between the processing time of the first processing and the line width in the inner region. Thus, in the above-described method, it becomes possible to adjust the line width distribution more easily by adjusting the processing time of the first processing.

The second parameter may be a start timing of the second processing in the developing processing. It is found out that there is a strong correlation between the start timing of the second processing and the line width in the peripheral region. Thus, in the above-described method, it becomes possible to adjust the line width distribution more easily by adjusting the start timing of the second processing.

In one exemplary embodiment, there is provided a computer-readable recording medium having stored thereon computer-executable instructions that, in response to execution, cause an apparatus to perform a substrate processing method described above.

In one exemplary embodiment, a substrate processing apparatus includes a developing unit comprising a holder configured to hold a substrate having a surface on which a resist film exposed by an i-ray is formed; a developing liquid supply configured to supply a developing liquid on the surface of the substrate held by the holder; an adjusting liquid supply configured to supply an adjusting liquid configured to suppress progress of development on a peripheral region of the surface of the substrate held by the holder; and a gas supply configured to supply a gas on an inner region located at an inner side than the peripheral region of the surface of the substrate held by the holder; and a control unit configured to control the developing unit to perform a developing processing on the substrate.

The developing processing includes supplying the developing liquid on the surface of the substrate by the developing liquid supply to form a liquid film of the developing liquid on the surface of the substrate; maintaining the liquid film of the developing liquid on the surface of the substrate by the holder such that the development on the surface of the substrate progresses; and performing, during the maintaining of the liquid film of the developing liquid on the surface of the substrate by the holder, a first processing of supplying the gas to the inner region by the gas supply and a second processing of supplying the adjusting liquid on the peripheral region by the adjusting liquid supply such that a degree of the development is adjusted between the peripheral region and the inner region. The control unit starts the second processing after a start time of the first processing and ends the second processing after an end time of the first processing in the developing processing. In the substrate processing apparatus, it becomes possible to easily adjust the line width distribution within the surface of the substrate, the same as in the above-described substrate processing method.

Hereinafter, the exemplary embodiments will be described in detail with reference to the accompanying drawings. In the following description, same parts or parts having same functions will be assigned same reference numerals, and redundant description thereof will be omitted.

[Substrate Processing System]

A substrate processing system 1 shown in FIG. 1 is a system configured to perform, on a workpiece W, formation of a photosensitive film, exposure of the photosensitive film, and development of the photosensitive film. The workpiece W as a processing target is, for example, a substrate, or a substrate having a film or a circuit formed thereon as a result of being subjected to a preset processing. The substrate is, for example, a silicon wafer. The workpiece W (substrate) may have a circular shape. The workpiece W may be a glass substrate, a mask substrate, a FPD (Flat Panel Display), or the like. When an edge of the wafer W is beveled (chamfered), a "front surface" of the workpiece W in this specification includes the bevel portion when seen from the front surface side of the wafer W. The photosensitive film is, by way of example, a resist film.

Figure 2:
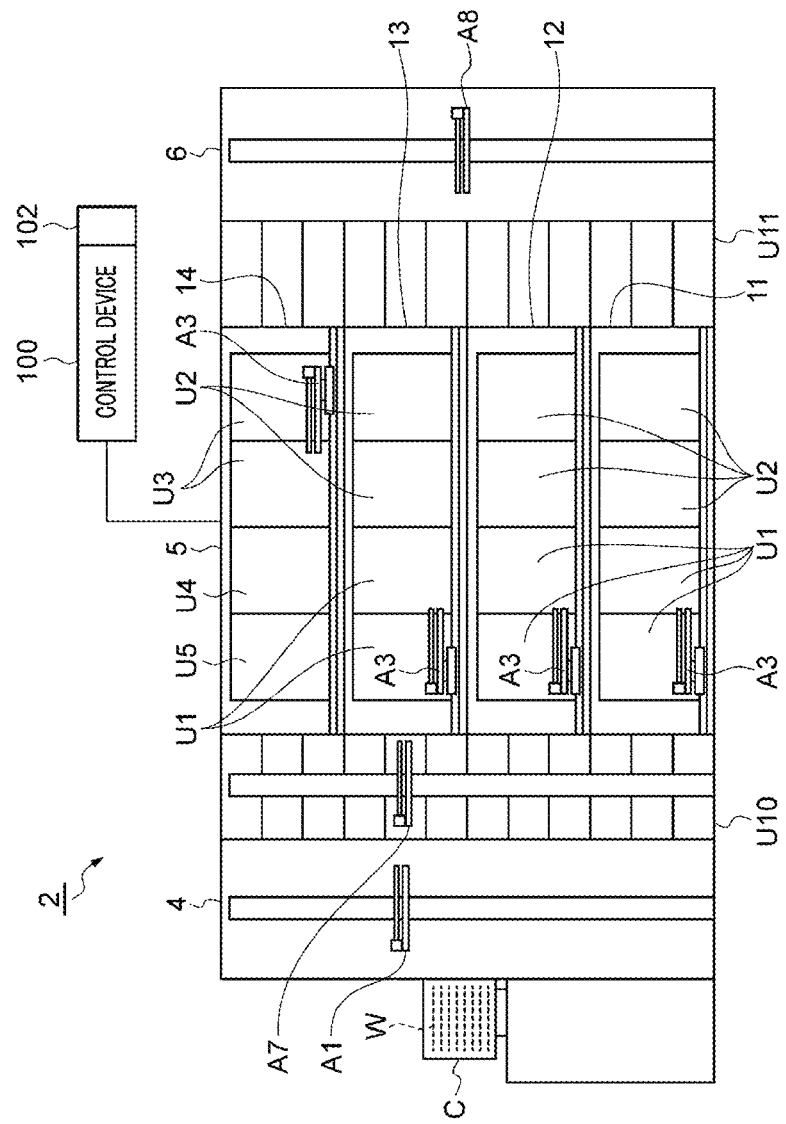
FIG. 2 is a schematic diagram illustrating an example of a coating and developing apparatus.

As depicted in FIG. 1 and FIG. 2, the substrate processing system 1 includes a coating and developing apparatus 2, an exposure apparatus 3, and a control device 100. The exposure apparatus 3 is configured to expose a resist film (photosensitive film) formed on the workpiece W (substrate) to light. To elaborate, the exposure apparatus 3 radiates an energy beam to an exposure target portion of the resist film by an immersion exposure method or the like. The energy beam is, for example, an ionizing radiation or a non-ionizing radiation.

The ionizing radiation is a radioactive ray having enough energy to ionize an atom or a molecule. The ionizing radiation may be, by way of non-limiting example, an EUV (Extreme Ultraviolet), an electronic beam, an ion beam, an X-ray, an α-ray, a β-ray, a γ-ray, a baryon beam, a proton beam, or the like. The non-ionizing radiation is a radioactive ray which does not have enough energy to ionize an atom or a molecule. The non-ionizing radiation may be, by way of non-limiting example, a g-ray, an i-ray, a KrF excimer laser, an ArF excimer laser, a $F_2$ excimer laser, or the like. In the following description, an example where an i-ray is used as the energy beam for the exposure will be explained.

The coating and developing apparatus 2 is configured to perform a processing of forming the resist film by coating a resist (chemical liquid) on a surface of the workpiece W prior to an exposure processing by the exposure apparatus 3, and is also configured to perform development of the resist film after the exposure processing. The resist film before being developed is exposed to the i-ray. That is, the exposure apparatus 3 radiates the i-ray selectively to the exposure target portion of the resist film before being subjected to the development. The coating and developing apparatus 2 includes a carrier block 4, a processing block 5, and an interface block 6.

The carrier block 4 is configured to carry the workpiece W into/from the coating and developing apparatus 2. For example, the carrier block 4 is configured to support a plurality of carriers C for workpieces W, and incorporates therein a transfer device A1 including a delivery arm. Each carrier C accommodates therein a multiple number of workpieces W having a circular shape, for example. The transfer device A1 is configured to take out the workpiece W from the carrier C, hand the workpiece W over to the processing block 5, receive the workpiece W from the processing block 5 and return the workpiece W back into the carrier C. The processing block 5 includes processing modules 11, 12, 13 and 14.

The processing module 11 incorporates therein a liquid processing unit U1, a heat treatment unit U2, and a transfer device A3 configured to transfer the workpiece W to these units. The processing module 11 is configured to form a bottom film on a front surface of the workpiece W by the liquid processing unit U1 and the heat treatment unit U2. The liquid processing unit U1 is configured to coat a processing liquid for the formation of the bottom film on the workpiece W. The heat treatment unit U2 is configured to perform various kinds of heat treatments required to form the bottom film.

The processing module 12 incorporates therein a liquid processing unit U1, a heat treatment unit U2, and a transfer device A3 configured to transfer the workpiece W to these units. The processing module 12 is configured to form a resist film on the bottom film by the liquid processing unit U1 and the heat treatment unit U2. The liquid processing unit U1 is configured to coat, on the bottom film, a processing liquid for the formation of the resist film. The liquid processing unit U1 coats, on the bottom film, a chemical liquid capable of forming a pattern through the exposure to the i-ray as the processing liquid for the formation of the resist film. The heat treatment unit U2 is configured to perform various kinds of heat treatments required to form the resist film.

The processing module 13 incorporates therein a liquid processing unit U1, a heat treatment unit U2, and a transfer device A3 configured to transfer the workpiece W to these units. The processing module 13 is configured to form a top film on the resist film by the liquid processing unit U1 and the heat treatment unit U2. The liquid processing unit U1 is configured to coat, on the resist film, a processing liquid for the formation of the top film. The heat treatment unit U2 is configured to perform various kinds of heat treatments required to form the top film.

The processing module 14 incorporates therein a developing unit U3, a heat treatment unit U4, a measurement unit U5, and a transfer device A3 configured to transfer the workpiece W to these units. The processing module 14 is configured to perform a developing processing on the resist film after being subjected to the exposure processing and perform heat treatments required for the developing processing by the developing unit U3 and the heat treatment unit U4. The developing unit U3 is a unit configured to perform a liquid processing using a developing liquid on the workpiece W. The developing unit U3 forms a liquid film (puddle) of the developing liquid on the surface of the workpiece W by supplying the developing liquid onto the surface of the workpiece W after being subject to the exposure processing.

The developing unit U3 is configured to perform development of the resist film by maintaining the liquid film of the developing liquid on the surface of the workpiece W (for example, stationary development). While the liquid film of the developing liquid is being maintained, heat dissipation starting from a peripheral portion of the workpiece W may be easily accelerated under an influence of airflow accompanying a gas exhaust or the like. As a result, a temperature difference may be generated in the surface of the workpiece W while the development is being performed. In this case, there may be caused discrepancy in the progress of the development in the surface of the workpiece W. In particular, on the resist film formed of another chemical liquid, the development degree is determined in about a few seconds after the liquid film of the developing liquid is formed. Meanwhile, when the resist film for i-ray is used, the development tends to continue at a substantially constant rate while the liquid film of the developing liquid is maintained.

As stated above, when the resist film for i-ray is used, the discrepancy in the degree of development may occur easily due to the temperature difference in a surface Wa of the workpiece W. Specifically, since the temperature is lowered in a peripheral region, the development may further proceed, so that the line width of the resist pattern in the peripheral region may be narrowed. Meanwhile, in the substrate processing system 1, the degree of development in the surface of the workpiece W is adjusted. A method of adjusting the degree of development in the surface of the workpiece W will be described later.

After performing the development with the developing liquid, the developing unit U3 rinses off the developing liquid on the surface of the workpiece W with a rinse liquid. The heat treatment unit U4 is configured to perform various kinds of heat treatments accompanying the development. Specific examples of the heat treatments include a heat treatment before development (PEB: Post Exposure Bake), a heat treatment after development (PB: Post Bake), and so forth. The measurement unit U5 is configured to measure the line width of the resist pattern on the surface of the workpiece W after being subjected to the developing processing. The measurement unit U5 may measure the line width of the resist pattern in any of various ways. By way of example, the measurement unit U5 is configured to be capable of measuring the line width at multiple measurement positions distributed across the entire surface of the workpiece W. The measurement unit U5 may measure the line width based on an image obtained by imaging the surface of the workpiece W after being subjected to the developing processing.

Within the processing block 5, a shelf unit U10 is provided near the carrier block 4. The shelf unit U10 is partitioned into a multiple number of cells arranged in a vertical direction. A transfer device A7 including an elevating arm is provided near the shelf unit 10. The transfer device A7 is configured to move the workpiece W up and down between the cells of the shelf unit U10. Within the processing block 5, a shelf unit U11 is provided near the interface block 6. The shelf unit U11 is partitioned into a multiple number of cells arranged in a vertical direction.

The interface block 6 is configured to deliver the workpiece W to/from the exposure apparatus 3. By way of example, the interface block 6 incorporates therein a transfer device A8 including a delivery arm, and is connected to the exposure apparatus 3. The transfer device A8 is configured to hand the workpiece W placed in the shelf unit U11 over to the exposure apparatus 3. The transfer device A8 is also configured to receive the workpiece W from the exposure apparatus 3 and return it back into the shelf unit U11.

The control device 100 (control unit) is configured to control the coating and developing apparatus 2 partially or in overall. The control device 100 controls the coating and developing apparatus 2 to perform a coating and developing processing in the following sequence, for example. First, the control device 100 controls the transfer device A1 to transfer the workpiece W in the carrier C to the shelf unit U10, and controls the transfer device A7 to put this workpiece W in the cell for the processing module 11.

Then, the control device 100 controls the transfer device A3 to transfer the workpiece W of the shelf unit U10 to the liquid processing unit U1 and the heat treatment unit U2 in the processing module 11. Further, the control device 100 controls the liquid processing unit U1 and the heat treatment unit U2 to form a bottom film on the surface of this workpiece W. Thereafter, the control device 100 controls the transfer device A3 to return the workpiece W with the bottom film formed thereon back into the shelf unit U10, and controls the transfer device A7 to place this workpiece W in the cell for the processing module 12.

Then, the control device 100 controls the transfer device A3 to transfer the workpiece W of the shelf unit U10 to the liquid processing unit U1 and the heat treatment unit U2 in the processing module 12. Further, the control device 100 controls the liquid processing unit U1 and the heat treatment unit U2 to form a resist film on the surface of this workpiece W. Thereafter, the control device 100 controls the transfer device A3 to return the workpiece W back into the shelf unit U10, and controls the transfer device A7 to put this workpiece W in the cell for the processing module 13.

Subsequently, the control device 100 controls the transfer device A3 to transfer the workpiece W of the shelf unit U10 to the individual units in the processing module 13. Further, the control device 100 controls the liquid processing unit U1 and the heat treatment unit U2 to form a top film on the resist film of the workpiece W. Thereafter, the control device 100 controls the transfer device A3 to transfer the workpiece W to the shelf unit U11.

Next, the control device 100 controls the transfer device A8 to send the workpiece W of the shelf unit U11 to the exposure apparatus 3. Then, the control device 100 controls the transfer device A8 to receive the workpiece W after being subjected to the exposure processing using the i-ray from the exposure apparatus 3 and to place the received workpiece in the cell for the processing module 14 in the shelf unit U11.

Afterwards, the control device 100 controls the transfer device A3 to transfer the workpiece W of the shelf unit U11 to the individual units in the processing module 14, and controls the developing unit U3 and the heat treatment unit U4 to perform development of the resist film of the workpiece W. As the development of the resist film is performed, a resist pattern is formed on the surface of the workpiece W.

Thereafter, the control device 100 controls the transfer device A3 to return the workpiece W to the shelf unit U10, and controls the transfer device A7 and the transfer device A1 to return this workpiece W back into the carrier C. Through these processes, the coating and developing processing for the single sheet of workpiece W is completed. The control device 100 causes the coating and developing apparatus 2 to carry out the coating and developing processing in the same way as described above, for each of a multiple number of workpieces W to be processed subsequently.

An input/output device 102 may be connected to the control device 100. The input/output device 102 is a device for inputting input information indicating an instruction from a user such as an operator to the control device 100 and outputting information from the control device 100 to the user. The input/output device 102 may include a keyboard, an operation panel, or a mouse as an input device, and may include a monitor (for example, a liquid crystal display) as an output device. The input/output device 102 may be a touch panel in which an input device and an output device are integrated. The control device 100 and the input/output device 102 may be integrated.

A specific configuration of the substrate processing apparatus is not limited to the configuration of the substrate processing system 1 described above. The substrate processing apparatus may be any of various types as long as it is equipped with a developing unit configured to perform development of a substrate having a resist film formed thereon and a control device capable of controlling the developing unit.

(Developing Unit)

Figure 3:
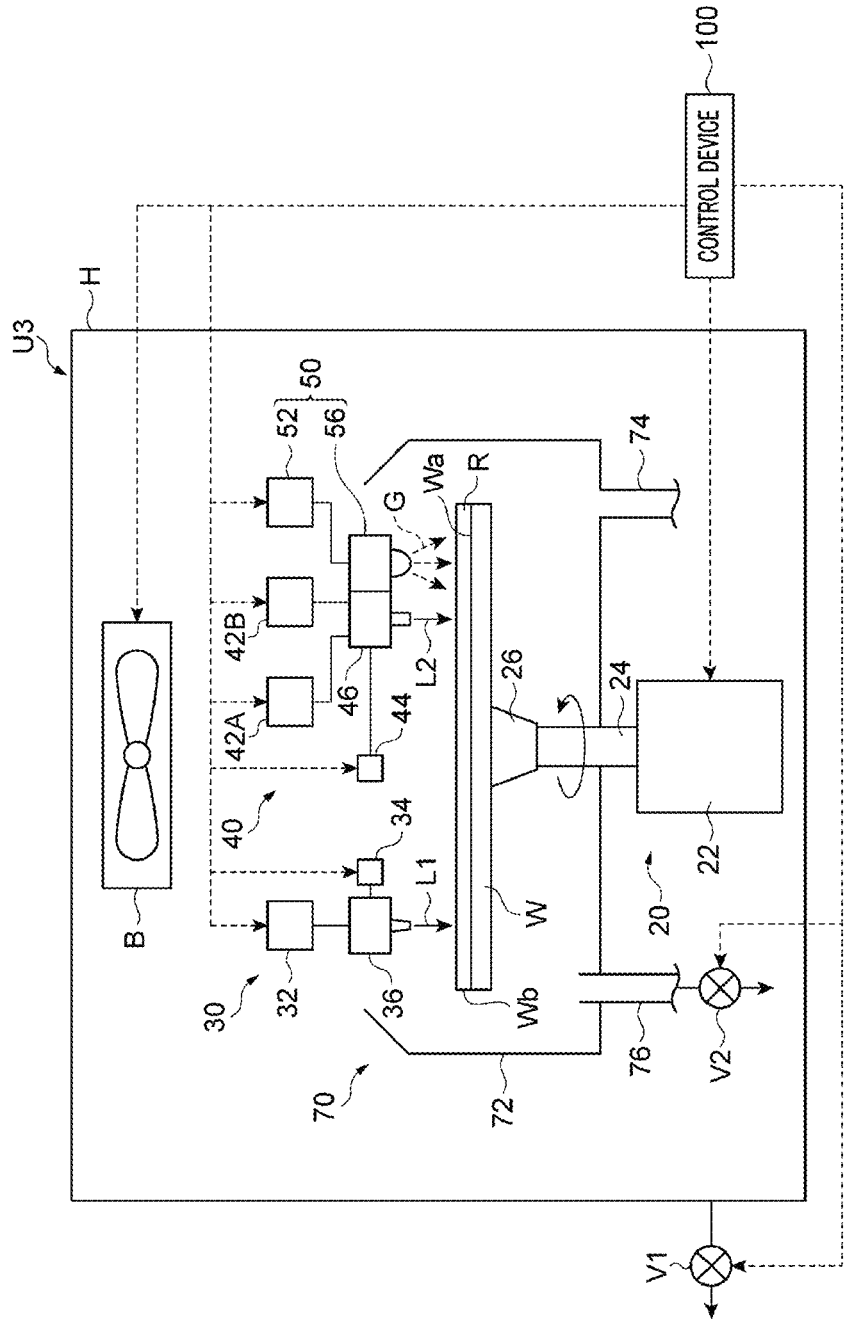
FIG. 3 is a schematic diagram illustrating an example of a developing unit.
Figure 4A:
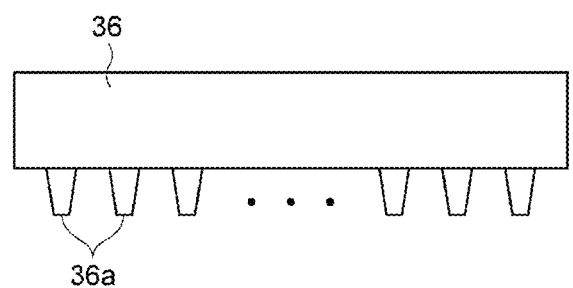
FIG. 4A and FIG. 4B are schematic diagrams illustrating an example of a nozzle configured to discharge a developing liquid.
Figure 4B:
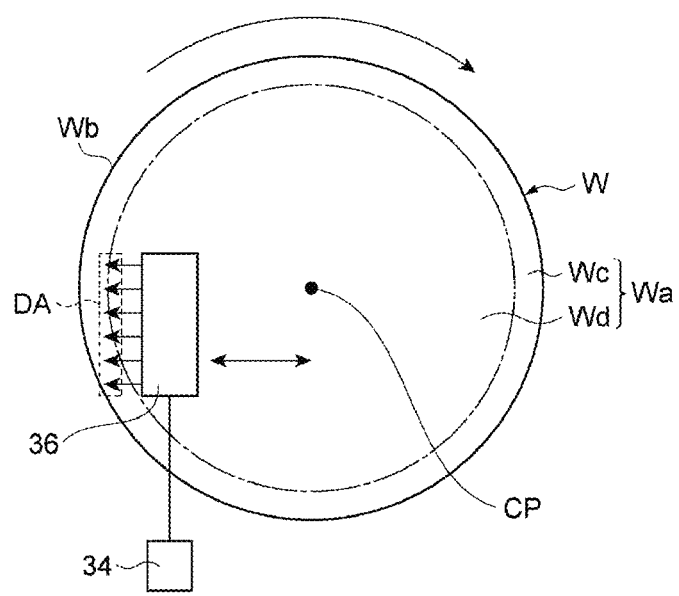

Now, referring to FIG. 3 to FIG. 4B, the developing unit U3 of the processing module 14 will be elaborated. As illustrated in FIG. 3, for example, the developing unit U3 includes a housing H, a rotating/holding unit 20, a developing liquid supply 30, an adjusting liquid supply 40, a gas supply 50, a cover member 70, and a blower B. The housing H accommodates therein the rotating/holding unit 20, the developing liquid supply 30, the adjusting liquid supply 40, the gas supply 50, the cover member 70, and the blower B.

The rotating/holding unit 20 (holder) holds and rotates the workpiece W. The rotating/holding unit 20 is capable of holding the workpiece W without rotating it, and also capable of holding the workpiece W while rotating it. The rotating/holding unit 20 includes, by way of example, a rotational driving unit 22, a shaft 24, and a holder 26. The rotational driving unit 22 is operated based on an operation instruction from the control device 100 to rotate the shaft 24. The rotational driving unit 22 includes, for example, a power source such as an electric motor.

The holder 26 is provided at a leading end of the shaft 24. The workpiece W is placed on the holder 26. The holder 26 holds the workpiece W in a substantially horizontal manner by, for example, attraction or the like. The rotating/holding unit 20 rotates the workpiece W around a central axis (rotation axis) perpendicular to the surface Wa of the workpiece W in the state that the workpiece W is placed in a substantially horizontal manner in posture. The holder 26 may hold the workpiece W so that the rotation shaft may substantially coincide with a center CP of the workpiece W (see FIG. 4B).

The developing liquid supply 30 supplies a predetermined chemical liquid to the surface Wa of the workpiece W held by the rotating/holding unit 20 (holder 26). The chemical liquid supplied by the developing liquid supply 30 is a developing liquid L1. The developing liquid L1 is a chemical liquid for performing development on the resist film (hereinafter, referred to as "resist film R") formed on the surface Wa of the workpiece W. In the present disclosure, the supply of a fluid such as a liquid or a gas (for example, the developing liquid L1) to the surface Wa of the workpiece W corresponds to bringing the fluid into contact with a film, such as the resist film R or the liquid film, formed on the surface Wa thereof.

The developing liquid supply 30 includes, for example, a liquid feeder 32, a driver 34, and a developing nozzle 36. The liquid feeder 32 sends the developing liquid L1 stored in a container (not shown) to the developing nozzle 36 by a pump or the like (not shown) based on an operation instruction from the control device 100. The driver 34 moves the developing nozzle 36 at least in a direction (horizontal direction) along the surface Wa of the workpiece W based on an operation instruction from the control device 100.

The developing nozzle 36 discharges the developing liquid L1 supplied from the liquid feeder 32 toward the surface Wa of the workpiece W. The developing nozzle 36 may be capable of discharging the developing liquid L1 to an area (hereinafter referred to as "discharge area DA") extending in one direction along the surface Wa of the workpiece W. The developing nozzle 36 includes, for example, a plurality of discharge ports 36a, as illustrated in FIG. 4A. The plurality of discharge ports 36a are arranged along one horizontal direction. When the developing liquid L1 discharged from each of the plurality of discharge ports 36a reaches the surface Wa of the workpiece W, adhesion regions to which the developing liquid L1 from the respective plurality of discharge ports 36a adhere are arranged in one direction. These multiple adhesion regions arranged in one direction form the discharge area DA by the developing nozzle 36, as shown in FIG. 4B.

The developing nozzle 36 is disposed such that the discharge area DA overlaps the center CP of the workpiece W in the direction in which the plurality of discharge ports 36a are arranged. A center position of the developing nozzle 36 in a lengthwise direction thereof may substantially coincide with the center CP in the direction in which the plurality of discharge ports 36a are arranged. Alternatively, the center position of the developing nozzle 36 in the lengthwise direction may be deviated from the center CP in the direction in which the plurality of discharge ports 36a are arranged. The length of the developing nozzle 36 in the lengthwise direction may be shorter than the diameter of the workpiece W. The length of the discharge area DA in an elongated direction thereof may be substantially coincident with the length of the developing nozzle 36 in the lengthwise direction.

The driver 34 may move the developing nozzle 36 in a direction (hereinafter referred to as a "moving direction") intersecting the discharge area DA by the developing nozzle 36. As an example, the driver 34 moves the developing nozzle 36 along the moving direction to allow the discharge area DA to be moved between a central region including the center CP and an edge Wb (end) of the surface Wa of the workpiece W. The developing nozzle 36 may discharge the developing liquid L1 vertically downwards or obliquely downwards. FIG. 4B illustrates an example where a discharge direction of the developing liquid L1 from the developing nozzle 36 is an obliquely downward direction.

Returning to FIG. 3, the adjusting liquid supply 40 supplies a predetermined liquid to the peripheral region of the surface Wa of the workpiece W held by the rotating/holding unit 20 (holder 26). The liquid supplied by the adjusting liquid supply 40 is an adjusting liquid L2. The adjusting liquid L2 is a liquid configured to suppress the progress of the development of the resist film R caused by the developing liquid L1. If the adjusting liquid L2 is added to the developing liquid L1, the progress of the development by the developing liquid L1 is reduced (inhibited) as compared to a case where the adjusting liquid L2 is not added to the developing liquid L1.

The kind of the adjusting liquid L2 supplied by the adjusting liquid supply 40 is not particularly limited as long as it is a liquid which does not advance the development of the resist film R. As a specific example of the adjusting liquid L2, water (for example, pure water) may be used. When the kind of the adjusting liquid L2 is water, the adjusting liquid L2 may also be used as a rinse liquid for washing away the developing liquid L1 on the surface Wa of the workpiece W. In this case, the adjusting liquid supply 40 has a function of supplying the rinse liquid to the surface Wa of the workpiece W in the state that the developing liquid L1 is supplied thereon.

The peripheral region of the surface Wa of the workpiece W is a region including the edge Wb of the surface Wa and the vicinity thereof. When the workpiece W is of a circular shape, the peripheral region is, for example, an annular region between the edge Wb and a circle located inside the edge Wb by about ⅕ to 1/15 of the radius of the workpiece W. In this case, the inner diameter of the peripheral region is about ⅘ to 14/15 of the radius of the workpiece W. Hereinafter, the peripheral region is expressed as "peripheral region Wc", and a region other than the peripheral region Wc on the surface Wa and located inside the peripheral region Wc is referred to as "inner region (Wd)" (see FIG. 4B).

The adjusting liquid supply 40 includes, for example, liquid feeders 42A and 42B, a driver 44, and an adjusting nozzle 46. The liquid feeders 42A and 42B send the adjusting liquid L2 stored in a container (not illustrated) to the adjusting nozzle 46 by a pump or the like (not shown) based on an operation instruction from the control device 100. In case of supplying the adjusting liquid L2 to the peripheral region Wc of the surface Wa, the adjusting liquid L2 is supplied to the adjusting nozzle 46 by the liquid feeder 42A. Meanwhile, when the adjusting liquid L2 is used as a rinse liquid, the adjusting liquid L2 is supplied to the adjusting nozzle 46 by the liquid feeder 42B.

A flow rate (flow rate per unit time) of the adjusting liquid L2 sent by the liquid feeder 42A may be smaller than a flow rate (flow rate per unit time) of the adjusting liquid L2 sent by the liquid feeder 42B. The driver 44 moves the adjusting nozzle 46 at least in the direction (horizontal direction) along the surface Wa of the workpiece W based on an operation instruction from the control device 100. By way of example, the adjusting nozzle 46 is movable by the driver 44 between a position where it is capable of supplying the developing liquid L1 to the peripheral region Wc and a position where it is capable of supplying the developing liquid L1 to the central region including the center CP of the surface Wa.

The adjusting nozzle 46 discharges the adjusting liquid L2 supplied from the liquid feeder 42A or the liquid feeder 42B toward the surface Wa of the workpiece W on the holder 26. The adjusting nozzle 46 may include a single discharge port. The adjusting liquid L2 discharged from the adjusting nozzle 46 adheres to the surface Wa at one position which overlaps with the surface Wa. As an example, the adjusting nozzle 46 is disposed above the surface Wa of the workpiece W, and then discharges the adjusting liquid L2 vertically downwards or obliquely downwards.

The gas supply 50 supplies a predetermined gas to the inner region Wd of the surface Wa of the workpiece W. The gas supplied by the gas supply 50 (hereinafter, referred to as "gas G") may be an inert gas such as, but not limited to, a nitrogen gas. The gas G is a cooling gas that locally cools the liquid film of the developing liquid L1. The gas supply 50 supplies the gas G onto the surface Wa at a flow rate that does not cause the surface Wa of the workpiece W having the liquid film of the developing liquid L1 formed thereon (more specifically, a film present directly under the developing liquid L1: the top film in the above-described example) to be exposed.

The gas supply 50 includes, for example, a gas feeder 52 and a gas nozzle 56. The gas feeder 52 sends the gas G stored in a container (not shown) to the gas nozzle 56 by a pump or the like (not shown). The gas nozzle 56 is disposed above the workpiece W, and may discharge the gas so that the gas is diffused in all directions (radially) as it is distanced away from the gas nozzle 56. The gas nozzle 56 is provided with, for example, a plurality of ejection ports extending in directions extending at different angles with respect to the surface Wa of the workpiece W. The gas nozzle 56 may be connected (fixed) to the adjusting nozzle 46. In this case, the driver 44 moves both the adjusting nozzle 46 and the gas nozzle 56 along the surface Wa.

The cover member 70 is disposed around the rotating/holding unit 20. The cover member 70 includes, for example, a cup main body 72, a drain port 74, and an exhaust port 76. The cup main body 72 functions as a liquid collecting container that receives the developing liquid L1 and the adjusting liquid L2 supplied to the workpiece W for a liquid processing on the workpiece W. The drain port 74 is provided at a bottom of the cup main body 72, and drains the liquid collected by the cup main body 72 to the outside of the developing unit U3. The exhaust port 76 is provided at the bottom of the cup main body 72.

The developing unit U3 has exhaust devices V1 and V2. The exhaust device V1 is provided in a lower portion of the housing H, and is operated based on an operation instruction from the control device 100 to exhaust the gas in the housing H. The exhaust device V1 may be, for example, a damper whose exhaust amount can be adjusted according to the opening degree thereof. By controlling the exhaust amount from the housing H through the exhaust device V1, the temperature, pressure, humidity, and the like within the housing H can be controlled. The exhaust device V1 may be controlled to evacuate the housing H all the time during the liquid processing upon the workpiece W.

The exhaust device V2 is provided at the exhaust port 76, and is operated based on an operation instruction from the control device 100 to discharge the gas within the cup main body 72. A descending flow (downflow) having flown around the workpiece W is exhausted to the outside of the housing H of the developing unit U3 through the exhaust port 76 and the exhaust device V2. The exhaust device V2 may be, for example, a damper whose exhaust amount can be adjusted according to the opening degree thereof. By adjusting the exhaust amount from the cup main body 72 through the exhaust device V2, the temperature, pressure, humidity, and the like within the cup main body 72 can be controlled.

The blower B is disposed above the rotating/holding unit 20 and the cover member 70 in the housing H of the developing unit U3. The blower B forms a descending flow toward the cover member 70 based on an operation instruction from the control device 100. The blower B may be controlled to form the descending flow all the time during the liquid processing upon the workpiece W.

(Control Device)

The control device 100 controls the developing unit U3 so as to perform the developing processing on the workpiece W. The developing processing includes supplying the developing liquid L1 to the surface Wa of the workpiece W so as to form the liquid film of the developing liquid L1 on the surface Wa of the workpiece W, and maintaining the liquid film of the developing liquid L1 on the surface Wa of the workpiece W so as to advance the development on the surface Wa of the workpiece W. Further, the developing processing includes performing a first processing and a second processing to be described later while the liquid film of the developing liquid L1 is maintained on the surface Wa of the workpiece W.

The first processing is a processing of supplying the gas G to the inner region Wd located inside the peripheral region Wc of the surface Wa of the workpiece W. The second processing is a processing of supplying the adjusting liquid L2 configured to suppress the progress of the development on the peripheral region Wc so as to adjust the degree of development (development level) between the peripheral region Wc and the inner region Wd. The control device 100 starts the second processing after a start time of the first processing, and ends the second processing after an end time of the first processing. The control device 100 may start the second processing during the first processing, or may start the second processing after the end time of the first processing.

Figure 5:
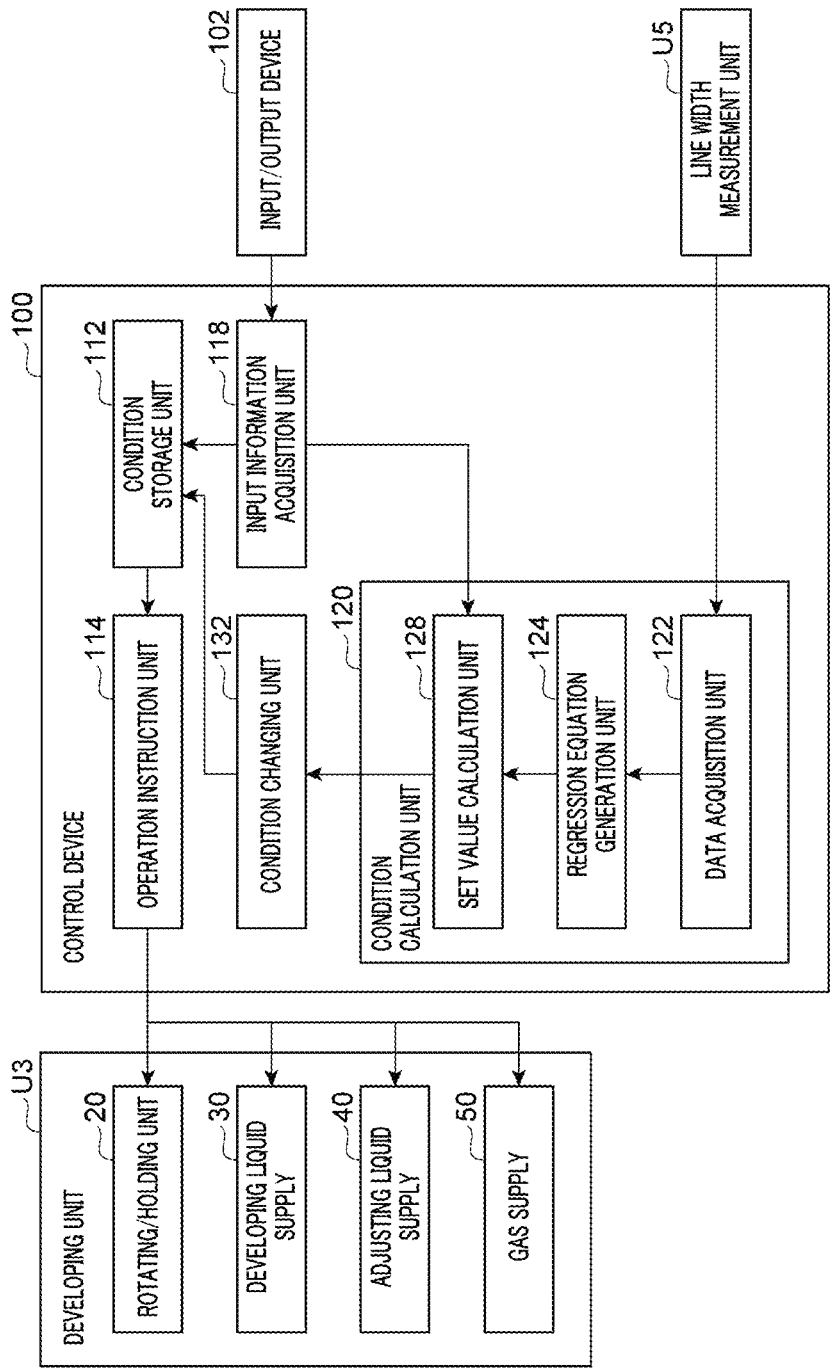
FIG. 5 is a block diagram illustrating an example of a functional configuration of a control device.

The control device 100 includes, as functional components (hereinafter, referred to as "functional modules"), a condition storage unit 112, an operation instruction unit 114, an input information acquisition unit 118, a condition calculation unit 120, and a condition changing unit 132, as shown in FIG. 5. A processing performed by these functional modules corresponds to a processing performed by the control device 100.

The condition storage unit 112 is a functional module configured to store processing conditions in the developing processing for the workpiece W. The processing conditions stored in the condition storage unit 112 include processing conditions in the first processing and processing conditions in the second processing. The operation instruction unit 114 is a functional module configured to control the developing unit U3 to perform the developing processing on the workpiece W according to the processing conditions stored by the condition storage unit 112. The input information acquisition unit 118 is a functional module configured to acquire input information indicating an instruction from the user through the input/output device 102. The input information acquisition unit 118 may display an interface image for the user to input the instruction on the monitor of the input/output device 102.

The condition calculation unit 120 is a functional module configured to calculate several parameter values that determine processing conditions in order to adjust the processing conditions in the developing processing. The condition calculation unit 120 calculates a value of an adjustment target parameter based on a result of a developing processing for testing that is performed to adjust the adjustment target parameter in the processing conditions. The adjustment target parameter includes a parameter (hereinafter, referred to as "first parameter") regarding a condition of the first processing including the supply of the gas G and a parameter (hereinafter, referred to as "second parameter") regarding a condition of the second processing including the supply of the adjusting liquid L2. The first parameter defines a part of the processing conditions in the first processing, and the second parameter defines a part of the processing conditions in the second processing. The condition calculation unit 120 includes a data acquisition unit 122, a regression equation generation unit 124, and a set value calculation unit 128.

The data acquisition unit 122 is a functional module configured to acquire, as the result of the developing processing for testing, a measurement result of the line width distribution of the resist pattern formed on the surface Wa from the measurement unit U5. The line width distribution is a distribution showing line widths at a plurality of measurement positions set on the surface Wa. The regression equation generation unit 124 is a functional module configured to generate regression equations for calculating set values of the first parameter and the second parameter based on the result obtained by the data acquisition unit 122. The set value calculation unit 128 is a functional module configured to calculate the set values of the first parameter and the second parameter by using the regression equations generated by the regression equation generation unit 124.

The condition changing unit 132 is a functional module configured to change (update) the processing conditions stored in the condition storage unit 112 based on the conditions calculated by the condition calculation unit 120. When the processing conditions are changed by the condition changing unit 132, the operation instruction unit 114 controls the developing unit U3 according to the changed processing conditions. Specifically, after the first parameter and the second parameter are set to the set values, the operation instruction unit 114 performs the first processing and the second processing included in the developing processing according to these set values.

Figure 6:
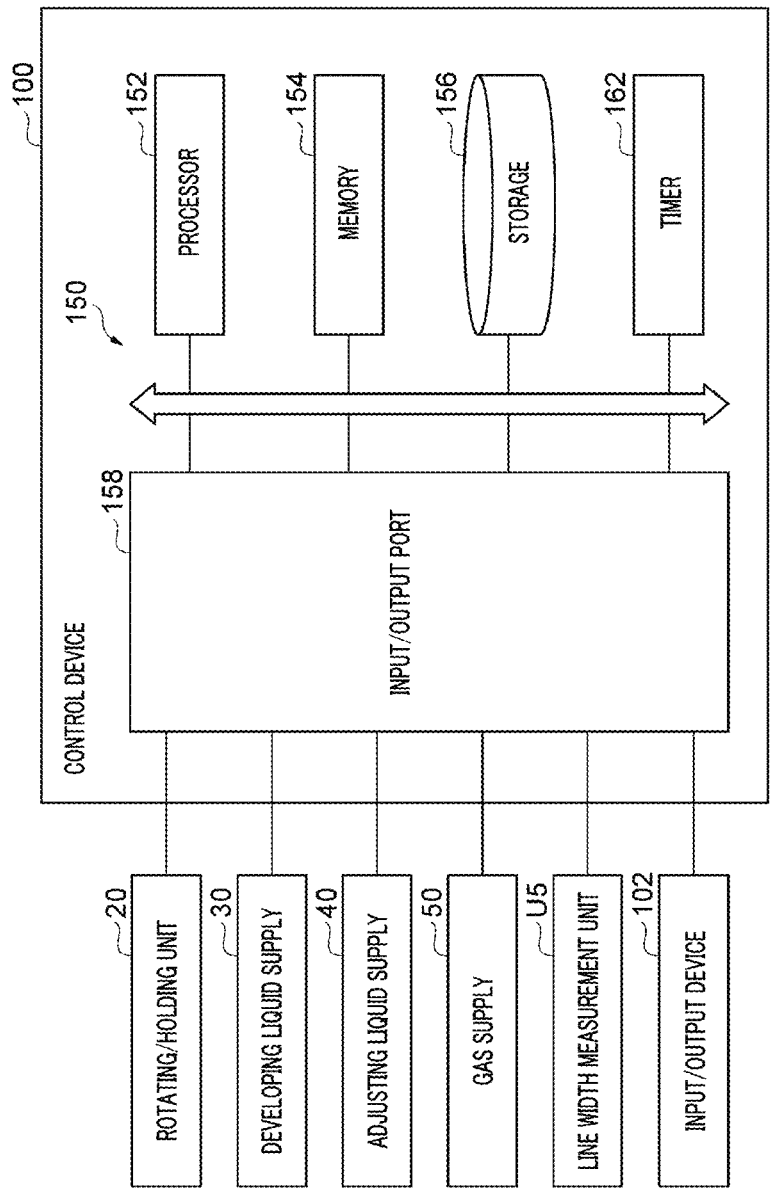
FIG. 6 is a block diagram illustrating an example of a hardware configuration of the control device.

The control device 100 may be implemented by one or more control computers. The control device 100 includes, for example, a circuit 150 shown in FIG. 6. The circuit 150 includes one or more processors 152, a memory 154, a storage 156, an input/output port 158, and a timer 162. The storage 156 has a computer-readable recording medium such as, but not limited to, a hard disk. The recording medium stores thereon a program which causes the control device 100 to implement a substrate processing method to be described later. The recording medium may be a portable medium such as a non-volatile semiconductor memory, a magnetic disk, or an optical disk.

The memory 154 temporarily stores thereon the program loaded from the recording medium of the storage 156 and an operation result by the processor 152. The processor 152 executes the aforementioned program in cooperation with the memory 154 to constitute the above-described functional modules. The input/output port 158 performs input/output of electric signals to/from the rotating/holding unit 20, the developing liquid supply 30, the adjusting liquid supply 40, the gas supply 50, the measurement unit U5, the input/output device 102, and so forth, in response to an instruction from the processor 152.

When the control device 100 is implemented by a plurality of control computers, each functional module may be implemented by an individual control computer. The control device 100 may be implemented by a control computer including the condition storage unit 112 and the operation instruction unit 114 and a control computer including the condition calculation unit 120. Alternatively, each of the functional modules may be implemented by a combination of two or more control computers. In these cases, the plurality of control computers may be configured to implement the substrate processing method in cooperation in the state that they are interconnected so as to be able to communicate with each other.

The hardware configuration of the control device 100 is not necessarily limited to constituting the individual functional module by the programs. By way of example, each functional module of the control device 100 may be implemented by a dedicated logic circuit or an ASIC (Application Specific Integrated Circuit) which is an integration of logical circuits.

[Substrate Processing Method]

Now, referring to FIG. 7 to FIG. 19, a series of processings performed by the control device 100 as an example of a substrate processing method will be explained. The series of processings implemented by the control device 100 include a series of processes in a stage (hereinafter referred to as "production stage") in which the developing processing is performed on the workpiece W by the developing unit U3, and a series of processes in a stage (hereinafter referred to as "preparation stage") in which the processing conditions of the developing processing are adjusted. In the production stage, the developing processing is performed on a next production workpiece W in which the adjustment result in the preparation stage is reflected on the processing conditions.

In the preparation stage, a developing processing for testing (test developing processing) for adjusting the processing conditions of the developing processing is performed. Specifically, the test developing processing is performed multiple times for a plurality of workpieces W for testing (test workpieces W), respectively. The test workpiece W (test substrate) is a workpiece of the same type as the workpiece W to be processed in the production stage. In the test developing processing, the developing processing is performed on the test workpiece W under the same processing conditions as in the production stage except for a parameter as a target of adjustment (adjusting target). In each of the plurality of test developing processings, the parameter as the target of adjustment is specified by a user and set to a corresponding test value. Further, before the developing processing is performed on the test workpiece W, this test workpiece W is subjected to formation of a resist film and heat treatment before the development under the same conditions as in the production stage.

The parameter as the target of adjustment includes a first parameter regarding the conditions of the first processing including the supply of the gas G, and a second parameter regarding the conditions of the second processing including the supply of the adjusting liquid L2. That is, the first parameter and the second parameter are adjusted in the preparation stage, and the developing processing is performed in the production stage according to the adjusted first and second parameters. Hereinafter, the description will be provided for an example where the first parameter is a processing time of the first processing, and the second parameter is a start timing of the second processing in the developing processing.

FIG. 7 illustrates a processing recipe in which processing conditions (processing schedules) at the time of performing the development in the developing unit U3 are defined. In the present disclosure, each of a plurality of processings included in the developing processing is referred to as "unit processing." In this processing recipe, the order and the processing time of each unit processing performed in the developing unit U3 are defined. As an example, the operation instruction unit 114 of the control device 100 starts a unit processing of No. 1 according to an instruction from a high-level controller, and then carries out each unit processing according to the processing recipe. In the processing recipe shown in FIG. 7, the first parameter (processing time of the first processing: X1) corresponds to a processing time t3 in a unit processing of No. 3. In addition, the second parameter (start timing of the second processing: X2) corresponds to a time period from a start time of the unit processing of No. 1 to a start time of a unit processing of No. 5.

<Preparation Stage>

Figure 8:
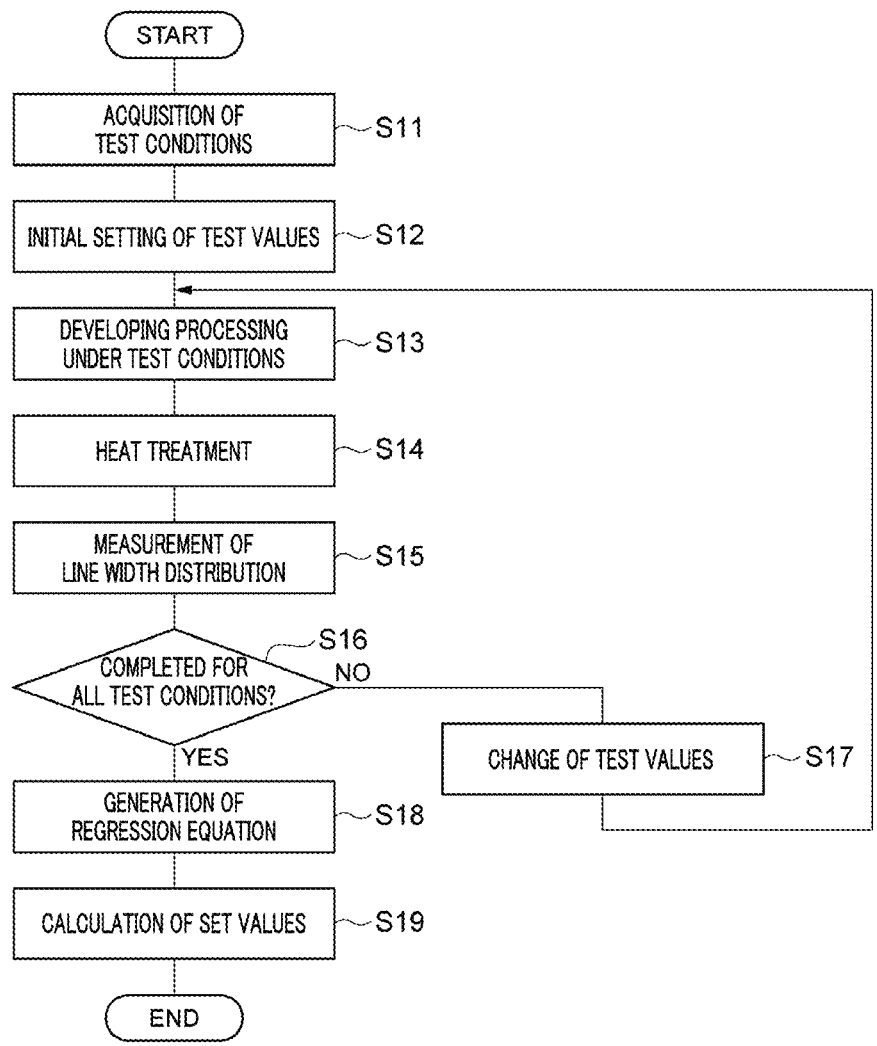
FIG. 8 is a flowchart illustrating an example of a method of setting parameters.

FIG. 8 is a flowchart showing an example of a series of processings performed by the control device 100 in the preparation stage. The control device 100 first performs a process S11. For example, in the process S11, the input information acquisition unit 118 acquires a user instruction indicating a test condition for the test developing processing to be performed on each of the plurality of test workpieces W. The input information acquisition unit 118 acquires information indicating a plurality of test conditions for the test developing processings to be performed multiple times. In each test condition, test values of the first parameter and the second parameter are previously set.

In the process S11, the plurality of test conditions are set by the user so that at least one of the first parameter or the second parameter is different. That is, in any two test conditions among the plurality of test conditions, either one of the first parameter or the second parameter is different, or both the first parameter and the second parameter are different. Here, the test value of the first parameter in the test developing processing performed at the $k^{th}$ time will be defined as "$p1_k$", and the test value of the second parameter in the test developing processing performed at the $k^{th}$ time will be defined as "$p2_k$". Here, k is an integer ranging from 1 to N, and N is an integer equal to or larger than 2. The plurality of test conditions include $(p1_1, p2_1)$, $(p1_2, p2_2)$, ..

. , and $(p1_N, p2_N)$. Here, N corresponds to the repetition number of the test developing processing.

Figure 14:
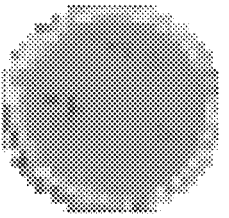
FIG. 14 is a table showing an example of measurement data actually measured to generate a regression equation.
Figure 14:
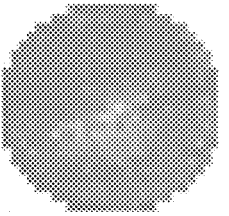
Figure 14:
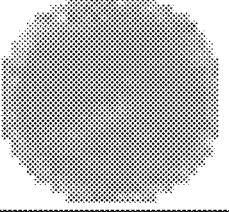
Figure 14:
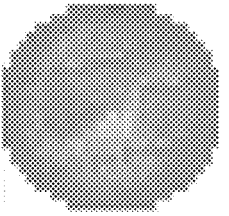

Each of $p1_k$ values and a variation range as a width between the minimum and maximum values of $p1_k$ are set as required by the user. Here, $p1_k$ includes two or more different values. All $p1_k$ values may be set to different, or some of these $p1_k$ values may be set to same. Each of $p2_k$ values and a variation range as a width between the minimum and maximum values of $p2_k$ are set as required by the user. Here, $p2_k$ includes two or more different values. All $p2_k$ values may be set to different, or some of these $p2_k$ values may be set to same. An example of the setting of $p1_k$ and $p2_k$ is shown in FIG. 14.

Then, the control device 100 performs processes S12 and S13. For example, in the process S12, the control device 100 performs initial setting of the test values. As an example, the control device 100 sets the first and second parameters to $(p1_1, p2_1)$. For example, in the process S13, the operation instruction unit 114 controls the developing unit U3 so that the developing processing is performed on the test workpiece W according to the test condition set immediately before. In the first test developing processing, the first processing is performed with the first parameter set to $p1_1$, and the second processing is performed with the second parameter set to $p2_1$. Details of the developing processing in the process S13 will be described later.

Then, the control device 100 performs processes S14 and S15. For example, in the process S14, the operation instruction unit 114 controls the heat treatment unit U4 to perform the heat treatment after development on the test workpiece W after being subjected to the developing processing of the process S13 under the same conditions as in the heat treatment in the production stage. For example, in the process S15, the data acquisition unit 122 acquires, from the measurement unit U5, a measurement result of a line width distribution of the resist pattern on the surface Wa of the test workpiece W after being subjected to the heat treatment after development in the process S14.

Subsequently, the control device 100 performs a process S16. For example, in the process S16, the control device 100 determines whether the developing processings under all the test conditions have been completed. If it is determined in the process S16 that the developing processings under all the test conditions have not been completed (process S16: NO), the processing to be performed by the control device 100 proceeds to a process S17. For example, in the process S17, the control device 100 changes the setting of the test values. After the first test developing processing is carried out, the control device 100 sets the first and second parameters to $(p1_2, p2_2)$.

Thereafter, the control device 100 repeatedly performs the series of processes S13 to S17 for each of the plurality of test workpieces W until the test developing processing is performed N times. As described above, the control device 100 performs the test developing processing on the test workpiece W for each test condition. Then, for each test condition (for each test developing processing), the control device 100 acquires measurement data of the line width distribution on the surface Wa of the test workpiece W after being subjected to the development.

When it is determined in the process S16 that the developing processing in all the test conditions have been completed (process S16: YES), the processing to be performed by the control device 100 proceeds to a process S18. For example, in the process S18, the regression equation generation unit 124 generates estimation information for predicting the line width distribution on the surface Wa of the workpiece W after being subjected to the development, based on the measurement data of the line width distribution obtained by repeating the process S15. The regression equation generation unit 124 generates, as the estimation information, a regression equation representing a relationship between the first and second parameters and the line width (predicted value of line width) of the resist pattern.

Then, the control device 100 performs a process S19. For example, in the process S19, the set value calculation unit 128 calculates the set values of the first parameter and the second parameter by using the regression equation generated in the process S18 such that the predicted line width distribution approaches a predetermined target distribution. Details of the method of generating the regression equation and the method of calculating the set values of the parameters in the processes S18 and S19 will be described later. Through the above-described operations, the control device 100 ends the series of processes in the preparation stage.

Figure 9:
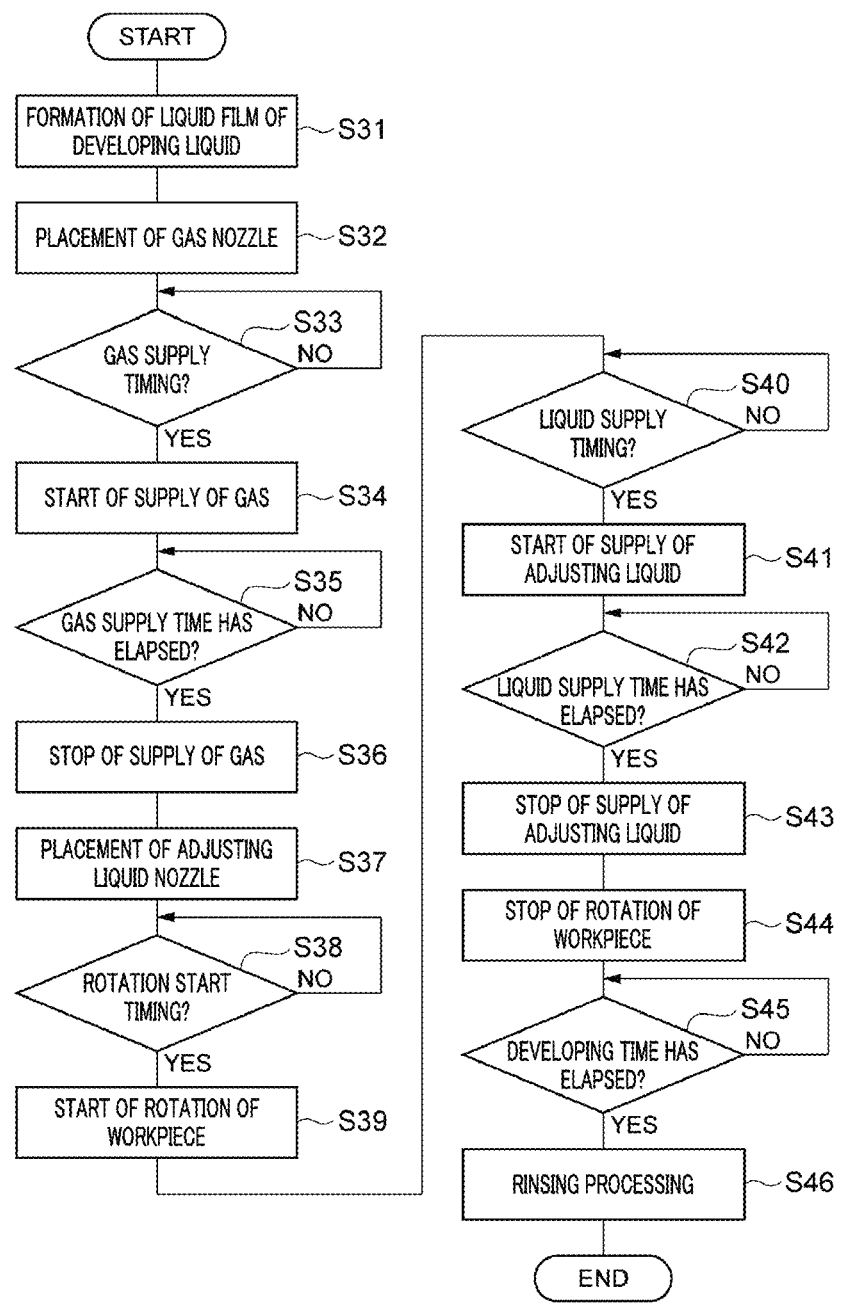
FIG. 9 is a flowchart illustrating an example of the developing processing.
Figure 10A:
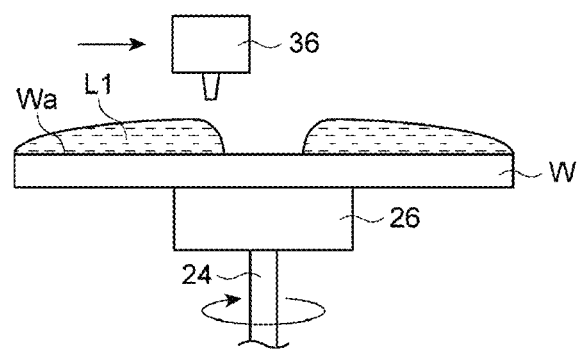
FIG. 10A is a schematic diagram illustrating an example of an operation of forming a liquid film of the developing liquid.

FIG. 9 is a flowchart showing an example of the test developing processing in the process S13. In this test developing processing, the control device 100 first performs a process S31 in the state that the test workpiece W is held by the rotating/holding unit 20. For example, in the process S31, the operation instruction unit 114 controls the developing unit U3 so that the liquid film of the developing liquid L1 is formed on the surface Wa of the test workpiece W. As an example, the operation instruction unit 114 controls the developing liquid supply 30 to move the developing nozzle 36 along the surface Wa while discharging the developing liquid L1 from the developing nozzle 36 in the state that the test workpiece W is rotated by the rotating/holding unit 20, as shown in FIG. 10A.

The operation instruction unit 114 may move the developing nozzle 36 by the driver 34 so that the discharge area DA (see FIG. 4B) of the developing liquid L1 from the developing nozzle 36 is moved to a central region (near the center) of the test workpiece W from the edge Wb thereof. At this time, as the discharge area DA approaches the central region, the operation instruction unit 114 may control the rotating/holding unit 20 so that the rotation of the test workpiece W is decelerated in stages. When stopping the discharge of the developing liquid L1 from the developing nozzle 36, the operation instruction unit 114 may stop the rotation of the test workpiece W by the rotating/holding unit 20.

Figure 10B:
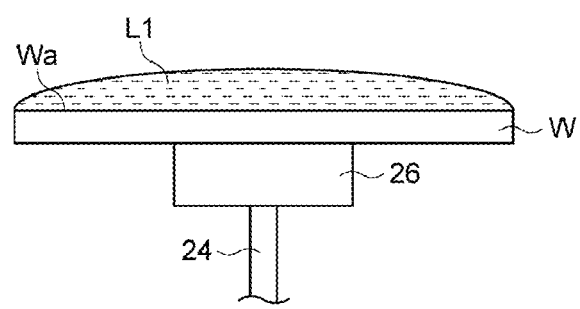
FIG. 10B is a schematic diagram illustrating an example of a state in which the liquid film of the developing liquid is formed.

As a result of the process S31, the liquid film of the developing liquid L1 is formed to cover substantially the entire surface Wa (resist film R) of the test workpiece W, as illustrated in FIG. 10B. In the subsequent processing, the operation instruction unit 114 controls the rotating/holding unit 20 so that the liquid film of the developing liquid L1 is maintained on the surface Wa of the test workpiece W until the liquid film of the developing liquid L1 is removed by the rinse liquid (for example, the adjusting liquid L2).

Figure 11A:
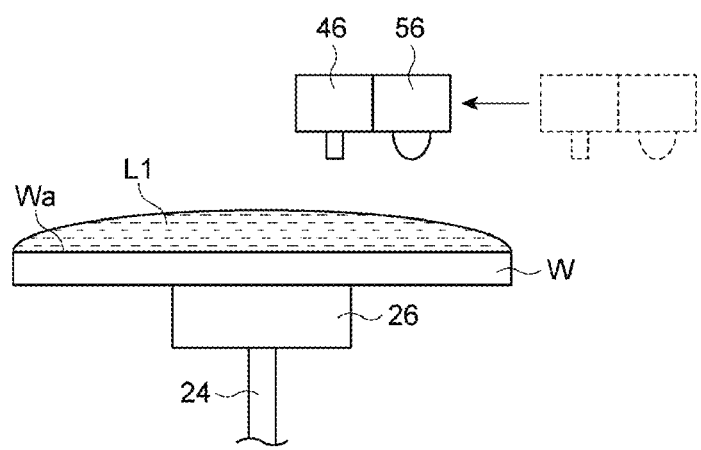
FIG. 11A and FIG. 11B are schematic diagrams illustrating an example of an operation of supplying a gas.

Thereafter, the control device 100 performs processes S32 and S33. For example, in the process S32, the operation instruction unit 114 controls the driver 44 to locate the gas nozzle 56 at a position where the gas G can be supplied to the inner region Wd on the surface Wa of the test workpiece W. FIG. 11A illustrates an example of the operation of placing the gas nozzle 56. For example, in the process S33, the operation instruction unit 114 stands by until a predetermined gas supply timing is reached. The gas supply timing is a condition that defines the time for starting the supply of the gas G, and is defined in the processing conditions. By way of example, the gas supply timing is defined as a period of time from a reference time point when the start time of the supply of the developing liquid L1 in the developing processing is taken as the reference.

Figure 11B:
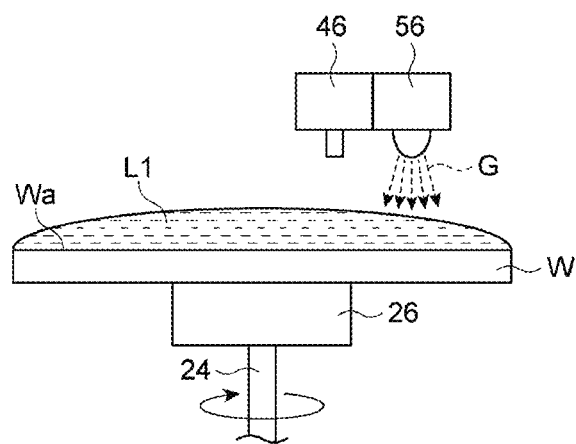

Then, the control device 100 performs a process S34. For example, in the process S34, the operation instruction unit 114 controls the gas feeder 52 of the gas supply 50 to start the discharge of the gas G from the gas nozzle 56. As a result, the gas G is supplied to the inner region Wd on the surface Wa of the test workpiece W. The operation instruction unit 114 may start the rotation of the workpiece W at substantially the same timing as the timing for starting the supply of the gas G from the gas nozzle 56 (the aforementioned supply timing). FIG. 11B illustrates a state in which the gas G is supplied on the inner region Wd by the gas nozzle 56. The operation instruction unit 114 may rotate the workpiece W by the rotating/holding unit 20 while the gas G is being supplied.

Then, the control device 100 performs processes S35 and S36. For example, in the process S35, the operation instruction unit 114 stands by until a preset gas supply time elapses from the aforementioned supply timing, which is the start time of the process S34. For example, in the process S36, the operation instruction unit 114 controls the gas feeder 52 to stop the supply (discharge) of the gas G from the gas nozzle 56. When stopping the supply of the gas G, the operation instruction unit 114 controls the rotating/holding unit 20 to stop the rotation of the workpiece W.

By performing the processes S34 to S36, the gas G is supplied to the inner region Wd on the surface Wa for as long as the gas supply time. The gas supply time is the first parameter that defines the condition of the first processing including the supply of the gas G, and its test value (set value in the test developing processing) corresponds to the aforementioned $p1_k$. That is, when the repetition number of the test developing processing is k, the first parameter is set to be $p1_k$.

Figure 12A:
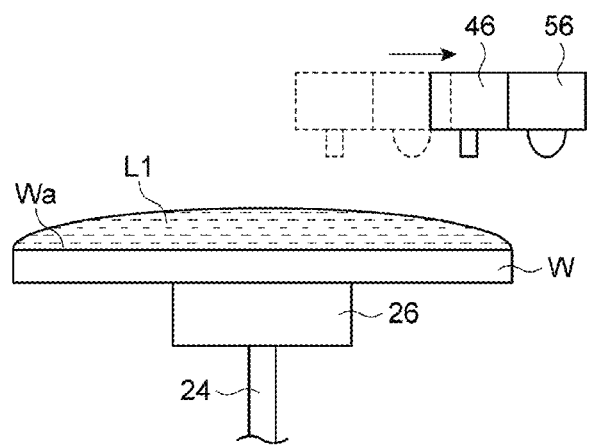
FIG. 12A and FIG. 12B are schematic diagrams illustrating an example of an operation of supplying an adjusting liquid.
Figure 12B:
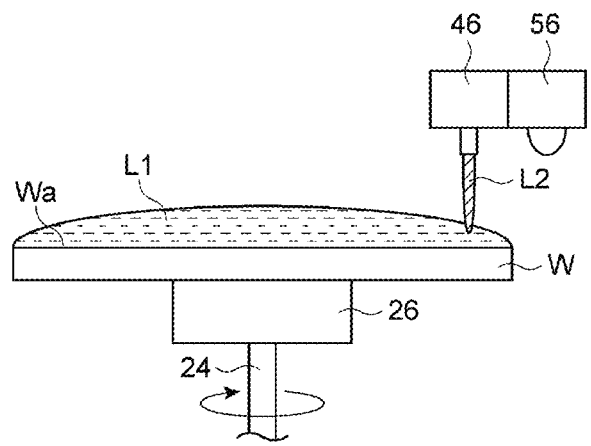

Subsequently, the control device 100 performs processes S37 and S38. For example, in the process S37, the operation instruction unit 114 controls the driver 44 to locate the adjusting nozzle 46 at a position where the adjusting liquid L2 can be supplied to the peripheral region We on the surface Wa of the test workpiece W. FIG. 12A illustrates an operation of moving the adjusting nozzle 46. For example, in the process S38, the operation instruction unit 114 stands by until a preset rotation start timing is reached. The rotation start timing is defined in the processing conditions. For instance, the rotation start timing is defined as a period of time from the start time of the supply of the developing liquid L1 (reference time point in the developing processing) in the developing processing.

Then, the control device 100 performs processes S39 and S40. For example, in the process S39, the operation instruction unit 114 starts the rotation of the workpiece W by the rotating/holding unit 20 so that the workpiece W is rotated at a preset rotation speed. For example, in the process S40, the operation instruction unit 114 stands by until a predetermined liquid supply timing is reached. The liquid supply timing is the second parameter that defines the condition of the second processing including the supply of the adjusting liquid L2, and its test value corresponds to the aforementioned $p2_k$. That is, when the repetition number of the test developing processing is k, the second parameter is set to be $p2_k$. For instance, the liquid supply timing (second parameter) is defined as a period of time from the start time of the supply of the developing liquid L1 in the developing processing (reference time point in the developing processing).

Then, the control device 100 performs a process S41. For example, in the process S41, the operation instruction unit 114 controls the liquid feeder 42A of the adjusting liquid supply 40 to start the discharge of the adjusting liquid L2 from the adjusting nozzle 46. As a result, the adjusting liquid L2 starts to be supplied to the peripheral region We on the surface Wa of the test workpiece W. The operation instruction unit 114 may control the rotating/holding unit 20 to increase the rotation speed of the test workpiece W at substantially the same timing as the timing at which the discharge of the adjusting liquid L2 from the adjusting nozzle 46 is started (the aforementioned liquid supply timing).

In the processing up to the process S41, the second processing including the supply of the adjusting liquid L2 is begun after the first processing including the supply of the gas G is finished. In this case, even between the time point when the supply of the gas G is stopped (the end time of the first processing) and the time point when the supply of the adjusting liquid L2 is started (the start time of the second processing), the liquid film of the developing liquid L1 is maintained on the surface Wa of the test workpiece W by the rotating/holding unit 20, so that the development of the resist film R proceeds.

Afterwards, the control device 100 performs processes S42 and S43. For example, in the process S42, the operation instruction unit 114 stands by until a preset liquid supply time passes by from the time point when the supply of the adjusting liquid L2 is started in the process S41. For example, in the process S43, the operation instruction unit 114 controls the liquid feeder 42A of the adjusting liquid supply 40 to stop the discharge of the adjusting liquid L2 from the adjusting nozzle 46. As a result, the supply of the adjusting liquid L2 to the peripheral region Wc is stopped. The liquid supply time is defined in the processing conditions, and is set to be a period of time enough to cause a difference in the progress of the development after the supply of the adjusting liquid L2 between the peripheral region Wc and the inner region Wd. As an example, the liquid supply time is set to be about 2 seconds to 10 seconds.

Subsequently, a process S44 is performed. In the process S44, the operation instruction unit 114 controls the rotating/holding unit 20 to stop the rotation of the test workpiece W. Even after the rotation of the workpiece W is stopped (after the supply of the adjusting liquid L2 is stopped), the liquid film of the developing liquid L1 is maintained on the surface Wa of the test workpiece W by the rotating/holding unit 20, so that the development proceeds. At this time, since the adjusting liquid L2 has been supplied on the peripheral region Wc, the degree of the progress of the development in the peripheral region Wc becomes smaller than that of the development in the inner region Wd.

Then, the control device 100 performs a process S45. For example, in the process S45, the operation instruction unit 114 stands by until a preset developing time elapses from the time point when the supply of the developing liquid L1 is begun in the process S31. The developing time is defined in the processing conditions, and is a condition that defines a period of time during which the liquid film of the developing liquid L1 is maintained on the surface Wa.

The developing time is set to be a constant time during the test developing processings which are performed repeatedly. Thus, according to the test values of the first parameter and the second parameter, the period of time from the stop of the supply of the gas G to the start of the supply of the adjusting liquid L2 and the period of time from the stop of the supply of the adjusting liquid L2 to the end of the developing processing change. In this case, the first parameter and the second parameter are respectively adjusted without changing the conditions that determine the period of time from the start of the supply of the developing liquid L1 to the start of the supply of the rinse liquid in a rinsing processing to be described later.

In the example of the processing recipe shown in FIG. 7, the developing time corresponds to a time DT from the beginning of the unit processing of No. 1 to the end of the unit processing of No. 6. In this processing recipe, in addition to the time DT, processing times t1, t2 and t5 may be set to constant values. The adjustment of the second parameter X2 may be carried out by the processing time t4 of the unit processing of No. 4. When the developing time (time DT) is set to be constant, the processing time t6 of the unit processing of No. 6 may be automatically adjusted according to the processing time t4.

Figure 13A:
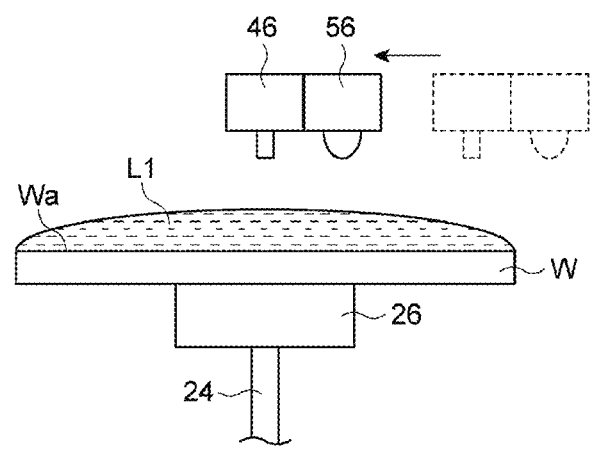
FIG. 13A and FIG. 13B are diagrams illustrating an example of an operation in a rinsing processing.

Referring back to FIG. 9, the control device 100 then performs a process S46. For example, in the process S46, the operation instruction unit 114 controls the developing unit U3 to perform the rinsing processing on the test workpiece W. By way of example, the operation instruction unit 114 controls the driver 44 to place the adjusting nozzle 46 at a position where the adjusting liquid L2 can be supplied to a rotation center of the test workpiece W, as illustrated in FIG. 13A.

Figure 13B:
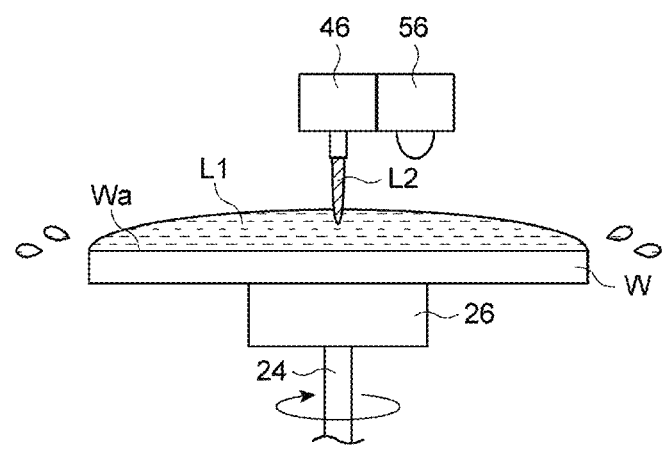

Then, as shown in FIG. 13B, the operation instruction unit 114 controls the liquid feeder 42B of the adjusting liquid supply 40 to supply the adjusting liquid L2 from the adjusting nozzle 46 to the surface Wa of the test workpiece W, while rotating the test workpiece W by the rotating/holding unit 20. Accordingly, the developing liquid L1 on the surface Wa of the test workpiece W is replaced with the adjusting liquid L2. The operation instruction unit 114 carries on the rotation of the test workpiece W by the rotating/holding unit 20 after the supply of the adjusting liquid L2 is stopped, thus allowing the adjusting liquid L2 to be removed from the surface Wa.

Through the above-described processes, the control device 100 completes the single-cycle of the developing processing for the test workpiece W. The control device 100 performs the test developing processing multiple times (N times) while varying the test values of the first parameter and the second parameter. The data acquisition unit 122 of the control device 100 may acquire the measurement result of the line width distribution from the measurement unit U5 every time the test developing processing is performed. During the multiple test developing processings, since the test value of at least one of the first parameter or the second parameter is different, the obtained measurement data of the line width distribution may be different. FIG. 14 provides a table showing examples of the test values of the first parameter and the second parameter for each test developing processing and examples of the measurement result of the line width distribution.

Figure 15B:
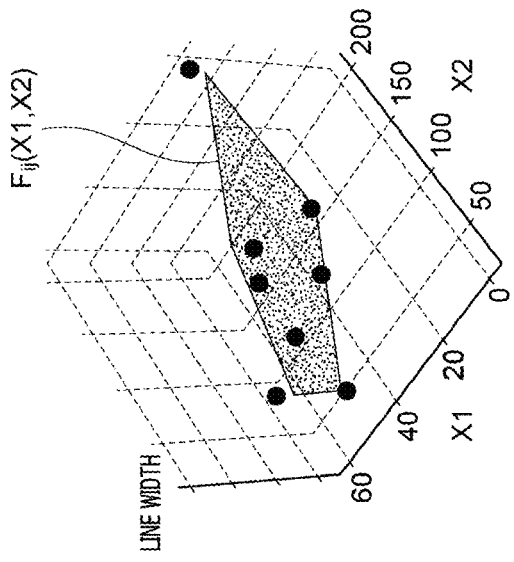
FIG. 15B is a graph for describing an example of the regression equation.
Figure 15A:
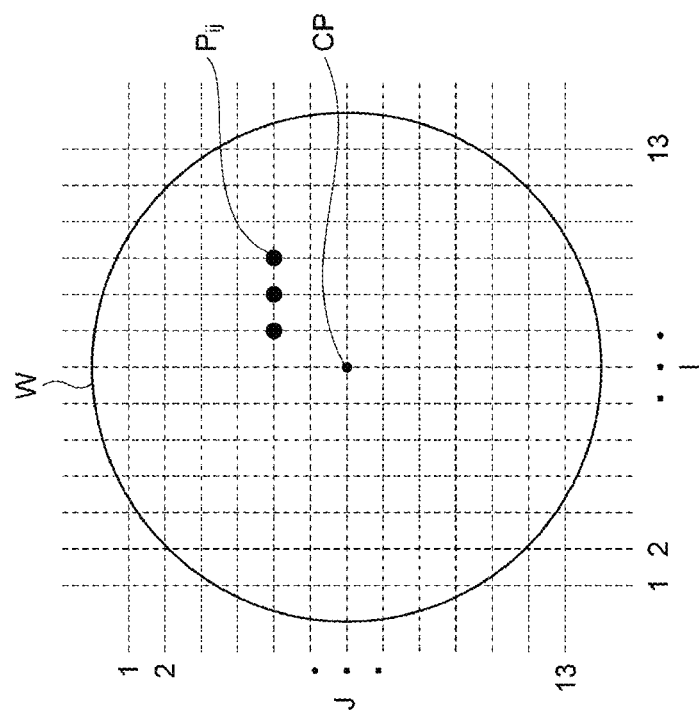
FIG. 15A is a schematic diagram illustrating an example of measurement positions set on a surface of a workpiece.

Now, an example of the method of generating the regression equation in the process S18 shown in FIG. 8 will be described in detail. FIG. 15A and FIG. 15B are schematic diagrams for explaining an example of the regression equation. The regression equation generation unit 124 of the control device 100 generates a regression equation representing a predicted value of the line width at each of multiple positions on the surface Wa of the workpiece W. The multiple positions at which the regression equations are respectively generated correspond to, for example, the plurality of measurement positions at which the line widths are measured in the measurement unit U5. The regression equation generation unit 124 generates a regression equation for each measurement position in the line width distribution measured after the test developing processing, based on the measured value (multiple measurement values) of the line width at the corresponding measurement position.

In FIG. 15A, "$P_{ij}$" represents each measurement position, and 'i' and 'j' represent the coordinates of two axes I and J along the surface Wa. In addition, in FIG. 15A, on each of the I-axis and the J-axis orthogonal to each other, thirteen points are set as the measurement positions. In this case, i, which is the coordinate of the I-axis, represents any one of values 1 to 13, and j, which is the coordinate of the J-axis, represents any one of 1 to 13. The number of the measurement positions along one direction is not limited to thirteen. The number of the measurement positions is set to such an extent that the tendency of the line width on the surface Wa can be observed. Coordinates located outside the edge Wb of the workpiece W are excluded from the measurement target and the generation target of the regression equation. In FIG. 15B, "$F_{ij}(X1, X2)$" represents a regression equation corresponding to each measurement position $P_{ij}$. For each measurement position $P_{ij}$, the regression equation generation unit 124 generates, based on the measurement data of the line width distribution, a regression equation representing a change in the line width (predicted value of the line width) according to the first parameter and the second parameter.

In FIG. 15B, measurement values of the line width measured at each measurement position $P_{ij}$ after the test developing processing are indicated by black circles. The regression equation generation unit 124 generates the regression equation (plane of regression) by performing regression analysis based on multiple measurement values of the line width at the respective measurement positions $P_{ij}$ and the test values of the first and second parameters under which those multiple measurement values of the line width are obtained. The regression equation generation unit 124 may perform the regression analysis in any of various ways, and the order of the regression equation may be first order or higher than first order. The following description will be provided for an example where the regression equation generation unit 124 generates the regression equation by ridge regression (ridge regression analysis).

In order to explain ridge regression, a typical linear regression by least-squares method will be first described. When the first parameter is denoted by "X1", the second parameter is denoted by "X2", and the predicted value of the line width of the resist pattern is defined as "F(X1, X2)", the first order linear regression equation (model function) is represented by the following expression (1).

[Expression 1]

$$F(X1, X2) = \beta1 \times X1 + \beta2 \times X2 + \beta0 \qquad (1)$$

In the expression (1), $\beta1$, $\beta2$ and $\beta0$ are coefficients ($\beta1$ and $\beta2$ are regression coefficients), and by determining these coefficients, it is possible to generate the regression equation representing the relationship between the first and second parameters and the predicted value of the line width. When array data of the measurement values of the line width at a certain measurement position is expressed as "$y_k$", $\beta1$, $\beta2$, and $\beta0$ are determined, in the typical linear regression using the least-squares method, to be of values allowing a cost function represented by the following expression (2) to become the minimum.

[Expression 2]

$$Cost(\beta) = \sum_{k=1}^{N} \{y_k - F(p1_k, p2_k)\}^2 \quad (2)$$

In expression (2), "β" means the aforementioned β1, β2 and β0. Further, as stated above, $p1_k$ denotes the test value (set value for testing) of the first parameter in the multiple test developing processings, and $p2_k$ represents the test value (set value for testing) of the second parameter in the multiple test developing processings. In case of using polynomial regression, a second order or higher regression equation with two variables is used instead of the regression equation expressed by the expression (1), and each coefficient is determined by using the expression (2).

When ridge regression (for example, first order ridge regression) is used, a regularization term is added to the cost function represented by expression (2). Specifically, β1, β2 and β0 (coefficients) are determined such that the cost function expressed by the following expression (3) becomes the minimum.

[Expression 3]

$$Cost(\beta) = \sum_{k=1}^{N} \{y_k - F(p1_k, p2_k)\}^2 + \lambda \times (\beta1^2 + \beta2^2) \quad (3)$$

In expression (3), the second term is the regularization term. In the regularization term included in the cost function in the ridge regression, the squares of all the regression coefficients (β1 and β2 in this example) are multiplied by a regularization parameter λ. The value of the regularization parameter may be set by the user or may be set to a predetermined value. Alternatively, when the regression equation generation unit 124 generates the regression equation, the optimum value of the regularization parameter may be calculated by a cross-validation method. By using the ridge regression (ridge regression analysis) when generating the regression equation, the absolute value of each regression coefficient can be reduced while leaving all the regression coefficients.

Figure 16A:
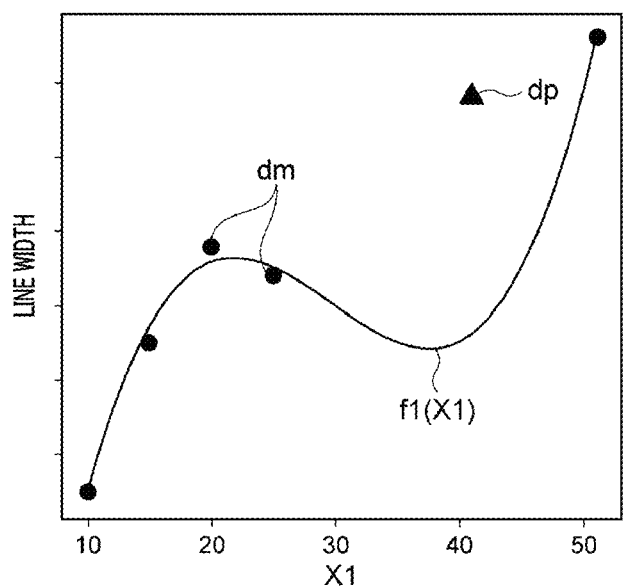
FIG. 16A is a graph showing an example of a regression equation by polynomial regression.
Figure 16B:
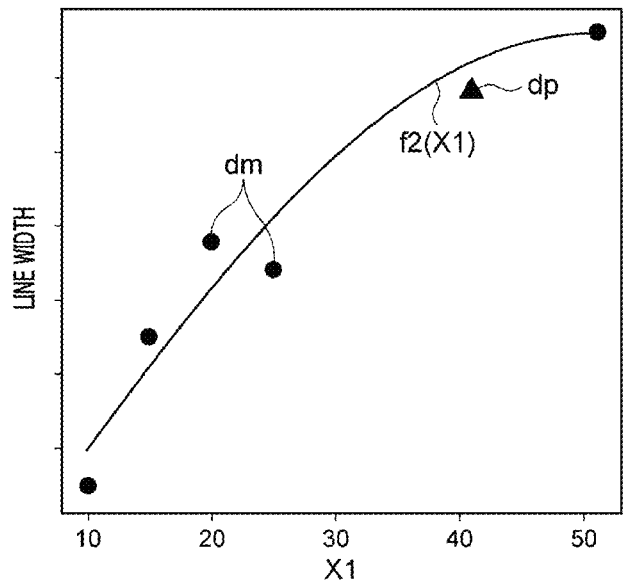
FIG. 16B is a graph showing an example of a regression equation by ridge regression.

Here, the difference between the regression equation obtained by the typical regression in which the regularization term is not included in the cost function and the regression equation obtained by the ridge regression will be described with reference to FIG. 16A and FIG. 16B. For simplicity of explanation, an example where a third order regression equation representing a relationship between the first parameter and the line width is generated will be described. In FIG. 16A, "f1(X1)" represents the typical third order regression equation, and in FIG. 16B, "f2(X1)" represents the third order regression obtained by the ridge regression analysis. In either case, the regression analysis is performed based on five measurement values (indicated by black circles denoted by "dm") to generate the third order regression equation.

The five measurement values do not include data in a range where the value of the first parameter X1 is about 30 to 45. In comparison of the graphs illustrated in FIG. 16A and FIG. 16B, the tendency to construct a regression equation by forcibly fitting it to the measurement data is found to be stronger in the typical regression analysis (f1(X1)), as compared to the ridge regression analysis (f2(X1)). For example, assuming that the value of the first parameter is about 40 and a measurement value is obtained at a position marked by a triangular denoted by "dp", the accuracy of prediction by f1(X1) is lower than that of f2(X1).

As described above, in the typical regression analysis, when there is a little measurement data (teaching data), a regression equation biased to the measurement data is constructed, and there is a risk of overlearning in which the accuracy of prediction for unknown data decreases. On the other hand, in the regression equation by the ridge regression analysis, since the regularization term is included in the cost function, the overlearning can be alleviated (suppressed) or eliminated as shown in FIG. 16B even if there is just a little measurement data.

Now, an example method of calculating the set value (adjustment value) of each of the first and second parameters in the process S19 shown in FIG. 8 will be elaborated. The set value of each parameter is calculated such that the predicted line width distribution (hereinafter, referred to as "prediction line width distribution") satisfies a preset condition. Here, there will be explained a case of calculating the set value which allows the prediction line width distribution to be more uniform. That is, the case where a line width of a target distribution is constant will be described. As an example, the control device 100 varies each of the first parameter and the second parameter in multiple stages, and calculates a prediction line width distribution for each combination of the changing stages. Then, the control device 100 extracts a distribution with the highest level of uniformity from the prediction line width distribution for each combination (a plurality of prediction line width distributions) to acquire the set value of each parameter.

Figure 17:
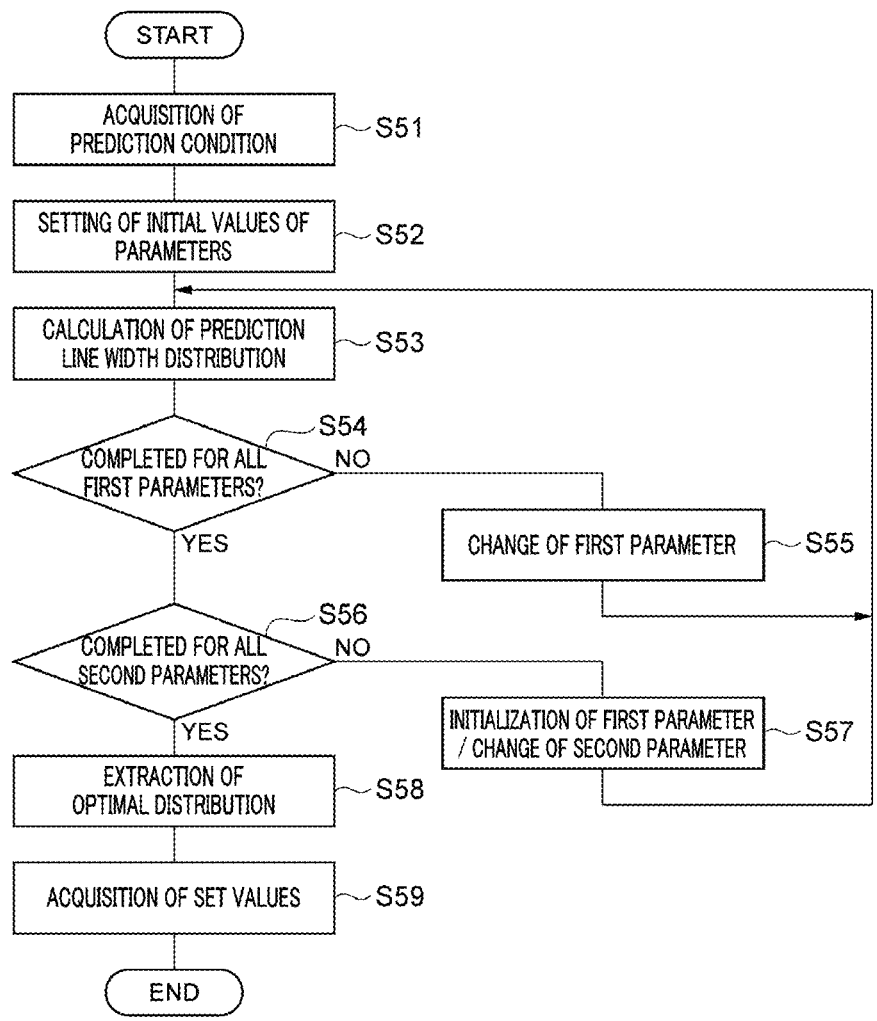
FIG. 17 is a flowchart showing an example of a parameter calculation method using the regression equation.
Figures 18A, 18B:
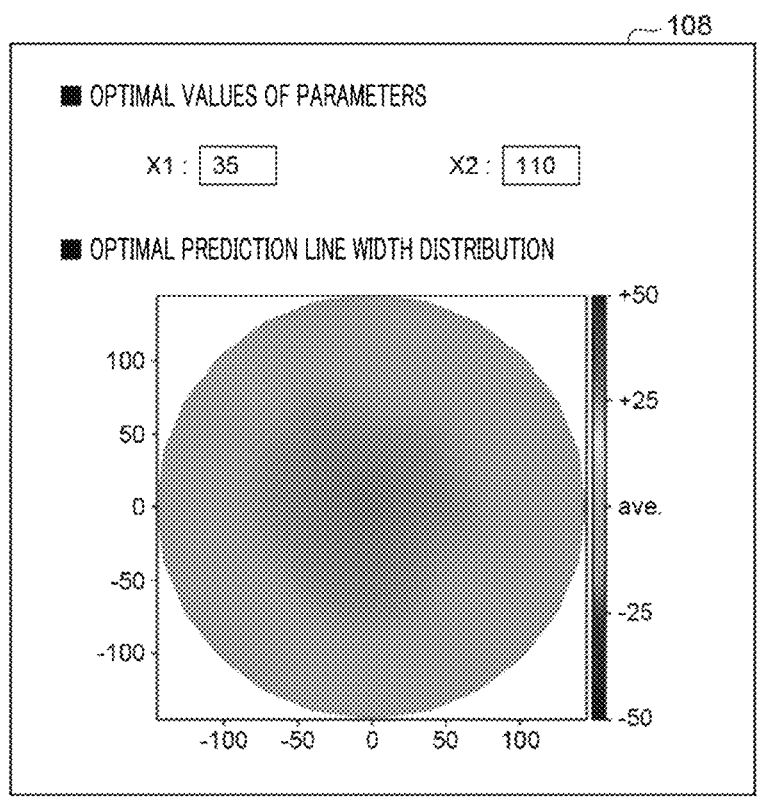
FIG. 18A is a schematic diagram showing an example of a set image at the time of predicting a line width distribution.
FIG. 18B is a schematic diagram showing an example of an image showing a prediction result.

FIG. 17 is a flowchart illustrating an example of the method of calculating the set value of each parameter. In this calculation method, the control device 100 first performs a process S51. For example, in the process S51, the input information acquisition unit 118 acquires a user instruction indicating a condition for performing prediction for calculating the set value. By way of example, the input information acquisition unit 118 displays a setting image 106 as shown in FIG. 18A on a monitor of the input/output device 102. A range in which each of the first parameter X1 and the second parameter X2 is varied and a variation pitch can be input to the setting image 106.

The input information acquisition unit 118 may acquire information indicating the condition for performing the prediction (simulation condition) based on a user input to the setting image 106. In the example shown in FIG. 18A, the range in which the first parameter X1 is varied is set to be 5 to 50, and the variation pitch thereof is set to be 5. Further, the range in which the second parameter X2 is varied is set to be 50 to 150, and the variation pitch thereof is set to 10. In this case, the first parameter is varied in stages in 5 units within the range of 5 to 50, and the second parameter is varied in stages in 10 units within the range of 50 to 150, and calculation of the prediction line width distribution is performed for each combination of the changing stages (for each of all combinations).

Subsequently, the control device 100 performs processes S52 and S53. For example, in the process S52, the set value calculation unit 128 sets the values of the first parameter and the second parameter (values for predicting the line width distribution) to initial values. For example, the set value calculation unit 128 sets the first parameter to 5, which is the minimum value of the variation range, and sets the second parameter to 50, which is the minimum value of the variation range. In the process S53, the set value calculation unit 128 inputs the values of the first parameter and the second parameter to the plurality of regression equations constructed for each of the plurality of measurement positions $P_{ij}$ to thereby calculate the prediction line width distribution.

Then, the control device 100 performs a process S54. For example, in the process S54, the set value calculation unit 128 makes a determination on whether or not the prediction in all the stages of varying the first parameter is ended. If it is determined that the prediction has not been completed in all the stages of varying the first parameter (process S54: NO), the processing to be performed by the control device 100 proceeds to a process S55. In the process S55, the set value calculation unit 128, for example, changes the first parameter from the current value to a value for which the prediction will be performed next. By way of example, the set value calculation unit 128 sets the first parameter to a value obtained by adding the variation pitch set in the process S51 to the current value.

On the other hand, if it is determined in the process S54 that the prediction has been completed in all the stages of varying the first parameter (process S54: YES), the processing to be performed by the control device 100 goes to a process S56. For example, in the process S56, the set value calculation unit 128 makes a determination on whether or not the prediction has been completed in all the stages of varying the second parameter. If it is determined that the prediction has not been finished in all the stages of varying the second parameter (process S56: NO), the set value calculation unit 128 returns the first parameter to the initial value, and changes the second parameter from the current value to a value for which the prediction will be performed next. By way of example, the set value calculation unit 128 sets the second parameter to a value obtained by adding the variation pitch set in the process S51 to the current value.

After the process S57, the control device 100 performs a processing of processes S53 to S56 (S57). Thus, after the second parameter is set to the next value, the calculation of the prediction line width distribution is repeated while the first parameter is varied in stages in a unit of the variation pitch. In the process S56, if it is determined that the prediction has been completed in all the stages of varying the second parameter (process S56: YES), the processing to be performed by the control device 100 proceeds to a process S58. As described above, in all the combinations of the stages of varying the first parameter and the stages of varying second parameter, prediction data of the line width distribution after the development is obtained.

For example, in the process S58, the set value calculation unit 128 evaluates the prediction data of the line width distribution calculated for each of the plurality of combinations of the stages of varying the first parameter and the stages of varying the second parameter. Specifically, the set value calculation unit 128 calculates, for each of a plurality of prediction line width distributions included in the prediction data, an index indicating uniformity of the line width (for example, a standard deviation a indicating non-uniformity of the line width). Then, the set value calculation unit 128 extracts the prediction line width distribution with the highest level of uniformity (for, with the smallest standard deviation a) from the prediction data as an optimal distribution.

Subsequently, the control device 100 performs a process S59. For example, in the process S59, the set value calculation unit 128 acquires the values of the first parameter and the second parameter allowing the acquisition of the prediction line width distribution extracted in the process S58 as the set values. When the set values are acquired (calculated), the control device 100 may display, on the monitor of the input/output device 102, an evaluation result image 108 showing the calculated set values and the prediction line width distribution obtained by using the calculated set values, as shown in FIG. 18B. Through the above-described processes, the processing of calculating the set values of the first parameter and the second parameter is completed.

<Production Stage>

Figure 19:
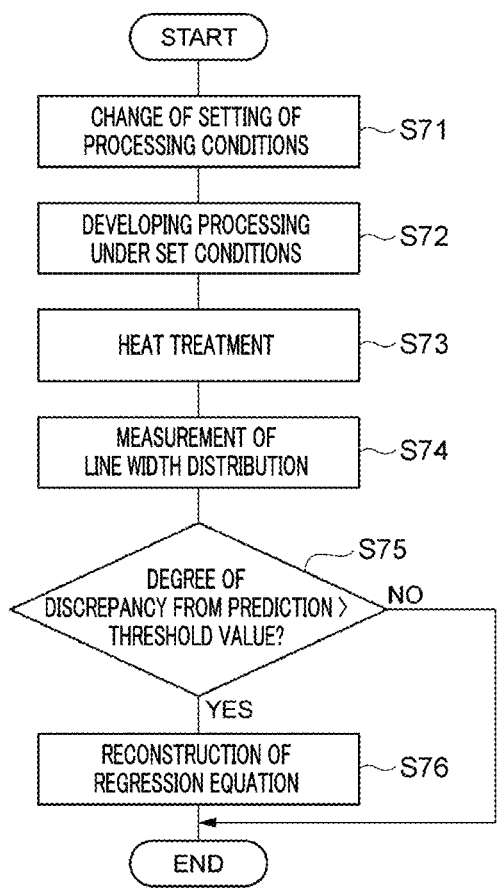
FIG. 19 is a flowchart showing an example of a substrate processing method after a condition setting.

FIG. 19 is a flowchart showing an example of a series of processes performed by the control device 100 in the production stage in which the developing unit U3 performs the developing processing on the workpiece W. In the following, the workpiece W to be processed in the production stage will be referred to as "a processing target workpiece W". For example, before the series of processes are performed, the exposure processing is performed on the resist film R formed on the surface Wa of the processing target workpiece W, and then the heat treatment before development is performed on the corresponding resist film R.

In these series of processes, the control device 100 first performs a process S71. For example, in the process S71, the condition changing unit 132 reflects the set values calculated by the set value calculation unit 128 in the preparation stage to the processing conditions stored by the condition storage unit 112. By way of example, the condition changing unit 132 updates (changes) the first parameter among the processing conditions stored in the condition storage unit 112 to the set value of the first parameter calculated in the preparation stage. Further, the condition changing unit 132 updates (changes) the second parameter among the processing conditions stored in the condition storage unit 112 to the set value of the second parameter calculated in the preparation stage. This process S71 can be performed in the preparation stage instead.

Then, the control device 100 performs processes S72 and S73. The control device 100 controls the developing unit U3 to perform the developing processing on the processing target workpiece W according to the processing conditions in which some of them are changed in the process S71. The control device 100 causes the developing unit U3 to perform the developing processing on the processing target workpiece W in the same way as in the process S13 shown in FIG. 8 (processes S31 to S46 shown in FIG. 9) except for the values of the first parameter and the second parameter.

In the developing processing performed at this time, the operation instruction unit 114 causes the developing unit U3 to carry out the first processing including the supply of the gas G according to the set value (updated value) of the first parameter. Further, the operation instruction unit 114 causes the developing unit U3 to carry out the second processing including the supply of the adjusting liquid L2 according to the set value (updated value) of the second parameter. In the process S73, the control device 100 controls the developing unit U3 to perform the heat treatment after development on the processing target workpiece W (the workpiece W with the resist pattern formed thereon), the same as in the process S14.

Thereafter, the control device 100 performs processes S74 and S75. For example, in the process S74, the data acquisition unit 122 acquires the measurement result of the line width distribution on the surface Wa of the processing target workpiece W from the measurement unit U5. For example, in the process S75, the regression equation generation unit 124 calculates a degree of discrepancy between the measurement value of the line width distribution (measured line width distribution) obtained in the process S74 and the prediction line width distribution extracted as the optimal distribution in the above-described process S58, and compares the calculated degree of discrepancy with a threshold value. The regression equation generation unit 124 evaluates the prediction accuracy of the regression equation generated in the process S18 by evaluating the degree of discrepancy between the measured line width distribution and the prediction line width distribution through comparison with the threshold value.

If it is determined in the process S75 that the degree of discrepancy between the measured line width distribution and the prediction line width distribution is larger than the preset threshold value (process S75: YES), the processing to be performed by the control device 100 proceeds to a process S76. For example, in the process S76, the regression equation generation unit 124 reconstructs a regression equation in the same manner as in the process S18. The regression equation generation unit 124 may reconstruct the regression equation after adding new measurement data to the measurement data (experimental data) used when constructing the regression equation for the first time. The added measurement data may include the measurement value of the line width distribution obtained in the process S74. The added measurement data may include a measurement value of the line width distribution obtained by additionally performing the test developing processing under conditions different from the aforementioned test conditions (test values of the first parameter and the second parameter) that are used when the measurement data first used is obtained.

If it is determined in the process S75 that the degree of discrepancy between the measured line width distribution and the prediction line width distribution is equal to or less than the preset threshold value (process S75: NO), the processing to be performed by the control device 100 does not processed to the process S76 but is just terminated. If the processing is ended as the degree of discrepancy is found to be equal to or less than the threshold value, the control device 100 may control the developing unit U3 to perform the developing processing and the heat treatment of the processes S72 and S73 repeatedly on a plurality of workpieces W to be processed subsequently. In this case, the control device 100 may not need to perform the processes S71, S74, and S75 (S76) for the plurality of subsequent workpieces W.

[Evaluation Result]

Figure 20A:
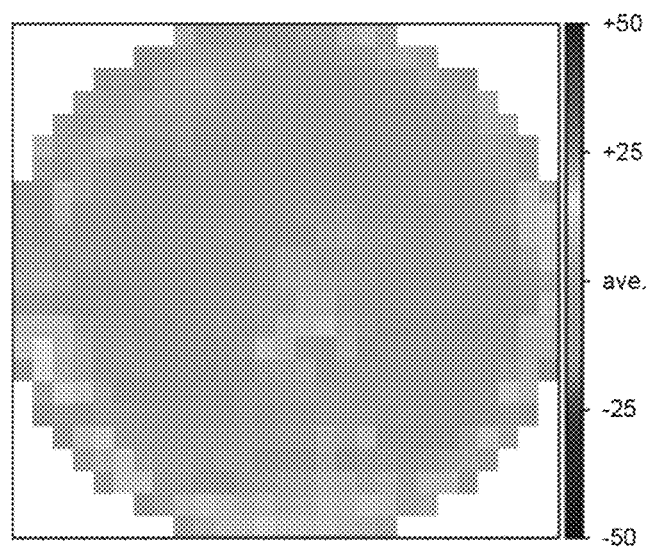
FIG. 20A is a graph showing an example of a measurement result of a line width distribution according to a first example.

Now, an evaluation result of the method of calculating (adjusting) the first parameter and the second parameter in the above-described preparation stage will be discussed. FIG. 20A shows an example of a measured line width distribution obtained by adjusting the first parameter and the second parameter by a method (a method according to a first example) different from the setting method in the preparation stage described above. In this measured line width distribution, color density represents a deviation amount from an average value of the line widths on the entire surface Wa. In the method according to the first example, after each of the values of the first parameter and the second parameter is varied in a preset pitch unit, the measurement data of the line width distribution on the surface Wa of the test workpiece W is evaluated. Then, from this measurement data, values allowing acquisition of the line width distribution with high level of uniformity are set to be the first parameter and the second parameter.

Figure 20B:
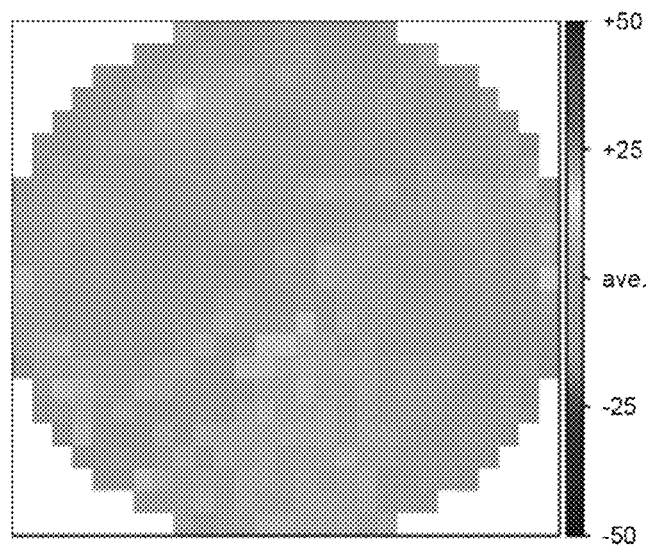
FIG. 20B is a graph showing an example of a line width distribution according to a second example.

FIG. 20B shows an example of a measured line width distribution obtained by adjusting the first parameter and the second parameter in the setting method (method according to a second example) in the preparation stage described above. In this distribution as well, color density represents a deviation amount from an average value of the line widths on the entire surface Wa. In the method according to the second example, measurement data is acquired to generate a regression equation. The repetition number of the test developing processing performed at this time is less than the repetition number of the test developing processing in the method according to the first example. When an index indicating the degree of uniformity is calculated and compared, the uniformity of the measured line width distribution obtained by the method according to the second example is found to be higher than the measured line width distribution obtained by the method according to the first example.

[Modification Examples]

The above-described series of processings performed by the control device 100 are nothing more than an example and can be modified appropriately. In the above-described series of processings, the control device 100 may perform one process and the next process in parallel, or may perform the individual processes in an order different from that described above. The control device 100 may omit any one process, and may perform a processing different from that described above in any one process.

The regression equation generation unit 124 may generate (construct) a regression equation representing the relationship between the first and second parameters and the predicted value of the line width by regression analysis other than the ridge regression. The regression equation generation unit 124 may generate a regression equation (model expression) by, for example, polynomial regression or linear regression in which a regularization term is not included in a cost function. The regression equation generation unit 124 may generate a regression equation by Lasso regression analysis or by elastic net regression analysis.

In the above-described example, the first parameter as a target of adjustment in the processing conditions of the first processing including the supply of the gas G is the processing time of the first processing (the supply time of the gas G). However, the first parameter is not limited thereto. The first parameter may be any condition as long as it is a condition that causes the degree of progress of the development in the inner region Wd to be changed. By way of example, the first parameter may be a timing at which the supply of the gas G is started, a supply position of the gas G on the surface Wa of the workpiece W (position of the gas nozzle 56), a discharge flow rate (flow rate per unit time) of the gas G, or a rotation speed of the workpiece W at the time when the gas G is supplied.

In the above-described example, the second parameter as a target of adjustment in the processing conditions of the second processing including the supply of the adjusting liquid L2 is the start timing of the supply of the adjusting liquid L2. However, the second parameter is not limited thereto. The second parameter may be any condition as long as it is a condition that causes the degree of progress of the development in the peripheral region We to be changed. By way of example, the second parameter may be a processing time of the second processing (supply time of the adjusting liquid L2), a discharge flow rate (flow rate per unit time) of the adjusting liquid L2, a discharge amount of the adjusting liquid L2, a temperature of the adjusting liquid L2, a supply position of the adjusting liquid L2 (position of the adjusting nozzle 46) on the surface Wa of the workpiece W, or a rotation speed of the workpiece W at the time when the adjusting liquid L2 is supplied.

A plurality of parameters (first parameters) may be adjusted for the processing conditions of the first processing, and a plurality of parameters (second parameters) may be adjusted for the processing conditions of the second processing. In this case, the regression equation generation unit 124 may generate a regression equation having three or more variables.

In the above-described example, the control device 100 adjusts the first parameter and the second parameter so that the line width distribution becomes uniform (so that the line width approaches a constant target line width distribution). Instead of this, the control device 100 may adjust the first parameter and the second parameter so that the line width approaches a target line width distribution which differs for individual regions. In this case, the set value calculation unit 128 may obtain (calculate), as the set values, the values of the first and second parameters which allow the difference between the target line width distribution and the prediction line width distribution obtained by using the regression equation to become the smallest.

In the above-described example, the line width is measured and evaluated at each of the multiple points distributed across the surface Wa of the workpiece W. However, the line width may be measured and evaluated on a certain line along a diametrical direction on the surface Wa of the workpiece W. The data acquisition unit 122 may acquire the measurement value of the line width distribution based on a data input from the user instead of acquiring the measurement value of the line width distribution from the measurement unit U5. In this case, the coating and developing apparatus 2 may not need to be equipped with the measurement unit U5 for measuring the line width.

The developing nozzle 36 configured to discharge the developing liquid L1, the adjusting nozzle 46 configured to discharge the adjusting liquid L2, and the gas nozzle 56 configured to discharge the gas G may not be limited to the aforementioned examples. The developing nozzle 36 having a single discharge port may be used, and this discharge port (slit) may be elongated in one horizontal direction. The adjusting nozzle 46 and the gas nozzle 56 may not be fixed to each other, and an additional driver configured to move the gas nozzle 56 may be provided in addition to the driver 44 configured to move the adjusting nozzle 46.

[Effects of Examplary Embodiments]

The substrate processing method described above includes performing the developing processing on the workpiece W. This developing processing includes supplying the developing liquid L1 on the surface Wa of the workpiece W to form a liquid film of the developing liquid L1 on the surface Wa of the workpiece W; maintaining the liquid film of the developing liquid L1 on the surface Wa of the workpiece W such that development progresses on the surface Wa of the workpiece W; and performing, during the maintaining of the liquid film of the developing liquid L1 on the surface Wa of the workpiece W, the first processing of supplying the gas G to the inner region Wd located at the inner side than the peripheral region Wc on the surface Wa of the workpiece W, and the second processing of supplying the adjusting liquid L2 configured to suppress progress of the development on the peripheral region Wc to adjust the degree of the development between the peripheral region Wc and the inner region Wb. In this substrate processing method, the second processing is started after the start time of the first processing, and the second processing is ended after the end time of the first processing.

By supplying the gas G, the temperature of the liquid film of the developing liquid L1 can be lowered to thereby accelerate the development, and by supplying the adjusting liquid L2 after the supply of the gas G, the progress of the development can be suppressed. Thus, in the above substrate processing method, the degree of the development can be adjusted between the inner region Wd and the peripheral region Wc by supplying the gas G and the adjusting liquid L2. Since the line width after the development varies according to the degree of the development, it becomes possible to easily adjust the line width distribution within the surface of the workpiece W in the above-described substrate processing method. Further, since the second processing is ended after the first processing is finished, the adjusting liquid L2 supplied to the peripheral region Wc is difficult to diffuse to other regions within the liquid film of the developing liquid L1 due to the supply of the gas G. Therefore, as compared to a case where the supply of the gas G is continued after the completion of the second processing, the adjustment of the line width distribution through the supply of the gas G and the adjusting liquid L2 is easily carried out.

In the substrate processing method, the second processing may be started after the end time of the first processing. The maintaining of the liquid film of the developing liquid L1 on the surface Wa of the workpiece W may include carrying on the maintaining of the liquid film of the developing liquid L1 on the surface Wa of the workpiece W between the end time of the first processing and a start time of the second processing. In this case, the period during which the gas G is supplied to the inner region Wd and the period during which the adjusting liquid L2 is supplied to the peripheral region Wc do not overlap with each other. Thus, the influence from one of the first and second processings to the other can be suppressed, so that the line width distribution can be more easily adjusted.

The substrate processing method may further include adjusting, before the performing of the developing processing on the workpiece W, the first parameter regarding the condition of the first processing and the second parameter regarding the condition of the second processing. The performing of the first processing and the second processing in the developing processing may include performing the first processing according to an adjusted first parameter and performing the second processing according to an adjusted second parameter. The supply of the gas G in the first processing affects the line width in the inner region Wd, and the supply of the adjusting liquid L2 in the second processing affects the line width in the peripheral region Wc. Thus, the line width distribution after development is changed by adjusting the parameters related to the conditions of the first processing and the second processing. Therefore, in the above-described method, by adjusting the parameters, it becomes possible to easily make the line width distribution approach the target distribution.

The substrate processing method may further include, before the adjusting of the first parameter and the second parameter, generating the estimation information in which the line width distribution on the surface Wa of the workpiece W after being subjected to the development is predicted. The generating of the estimation information may include performing the test developing processing corresponding to the developing processing on the test workpiece W while varying each of the first parameter and the second parameter; acquiring, for each combination of the first parameter and the second parameter, the measurement data of the line width distribution on the surface Wa of the test workpiece W after being subjected to the development; and generating, for each of the multiple positions on the surface Wa of the test workpiece W, the regression equation representing a change in the line width according to the first parameter and the second parameter, based on the measurement data. The adjusting of the first parameter and the second parameter may include calculating, based on the regression equation, the set value of the first parameter and the set value of the second parameter at the time of performing the developing processing such that the line width distribution on the surface Wa of the workpiece W after being subjected to the development satisfies the predetermined condition.

As a way to adjust the first parameter and the second parameter, the operator may check the line width distribution obtained according to the certain test conditions, and may adjust the first parameter and the second parameter by repeating changing the parameters and checking the measurement values based on the experience or skills. Alternatively, it may be considered to slightly change each of the first parameter and the second parameter and acquire the measurement data of the line width distribution in all possible combinations thereof to adjust the parameters. In the above-described method, however, it is possible to quantitatively evaluate the influence of the change in the condition of each of the first processing and the second processing on the line width distribution by using the estimation information. Therefore, it is possible to adjust the parameters even if the operator is not skillful. Further, since there is no need to repeat trials and errors a lot, it becomes possible to shorten the time required to adjust the parameters. Therefore, by adjusting the parameters using the estimation information, it becomes possible to adjust the processing conditions such that the line width distribution satisfies the predetermined condition (for example, such that the uniformity of the line width distribution increases) without course to the trials and errors by the operator or the experience of the operator.

The calculating of the set value of the first parameter and the set value of the second parameter based on the regression equation and the target distribution may include calculating, based on the regression equation, prediction data of the line width distribution after the development for each combination of multiple stages when changing each of the first parameter and the second parameter in the multiple stages; and acquiring, in the prediction data, a value of the first parameter and a value of the second parameter in a combination, in which the highest uniformity of the line width distribution is obtained, as the set value of the first parameter and the set value of the second parameter. In this case, as the developing processing is performed after each of the first parameter and the second parameter is set to the calculated set values, it is possible to obtain a line width distribution with improved in-plane uniformity. Thus, the above-described method enables to easily improve the uniformity of the line width distribution within the surface of the workpiece W.

The generating of the regression equation may include generating the regression equation by performing ridge regression analysis based on the measurement data and respective values of the first and second parameters under which the measurement data is obtained. By performing the ridge regression analysis, overlearning can be alleviated even when the number of the measurement data is small. Thus, the method enables to achieve both the improvement of prediction accuracy and shortening of the adjustment of processing conditions.

The developing processing may include supplying the rinse liquid to the surface Wa of the workpiece W after maintaining of the liquid film of the developing liquid L1. The adjusting of each of the first parameter and the second parameter may include adjusting each of the first parameter and the second parameter without changing a condition that determines a period of time from the start time of the supplying of the developing liquid L1 to a start time of the supplying of the rinse liquid. In this case, the line width distribution can be adjusted without changing the processing time of the developing processing. Thus, it becomes possible to adjust the line width distribution without changing a throughput.

The first parameter may be a processing time of the first processing. It is found out that there is a strong correlation between the processing time of the first processing and the line width in the inner region Wd. Thus, in the above-described method, it becomes possible to adjust the line width distribution more easily by adjusting the processing time of the first processing.

The second parameter may be a start timing of the second processing in the developing processing. It is found out that there is a strong correlation between the start timing of the second processing and the line width in the peripheral region Wc. Thus, in the above-described method, it becomes possible to adjust the line width distribution more easily by adjusting the start timing of the second processing.

As described above, by using the ridge regression, it becomes possible to generate a regression equation with high accuracy with a small amount of measurement data while alleviating overlearning. As another method of alleviating the overlearning, it may be also considered to use Lasso regression or the like. In Lasso regression, however, a regression coefficient regarded as having weak correlation with the line width may be set to be zero in some cases. When the first parameter is the processing time of the first processing and the second parameter is the start timing of the second processing, the correlation between these parameters and the line width is strong. Thus, in this case, it is deemed to be appropriate to use the ridge regression rather than the Lasso regression.

According to the exemplary embodiment, it is possible to provide the substrate processing method, the recording medium, and the substrate processing apparatus capable of adjusting the line width distribution on the surface of the substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A substrate processing method, comprising:
   performing a developing processing on a substrate,
   wherein the developing processing comprises:
   supplying a developing liquid on a surface of the substrate to form a liquid film of the developing liquid on the surface of the substrate;
   maintaining the liquid film of the developing liquid on the surface of the substrate such that development progresses on the surface of the substrate; and
   performing, during the maintaining of the liquid film of the developing liquid on the surface of the substrate, a first processing of supplying a gas to an inner region located inward of a peripheral region on the surface of the substrate and a second processing of supplying an adjusting liquid configured to suppress progress of the development on the peripheral region to adjust a degree of the development between the peripheral region and the inner region, and wherein the second processing is started after a start time of the first processing, and the second processing is ended after an end time of the first processing.

2. The substrate processing method of claim 1, wherein the second processing is started after the end time of the first processing, and the maintaining of the liquid film of the developing liquid on the surface of the substrate comprises carrying on the maintaining of the liquid film of the developing liquid on the surface of the substrate between the end time of the first processing and a start time of the second processing.

3. The substrate processing method of claim 1, further comprising:

adjusting, before the performing of the developing processing on the substrate, a first parameter regarding a condition of the first processing and a second parameter regarding a condition of the second processing, wherein the performing of the first processing and the second processing in the developing processing comprises performing the first processing according to an adjusted first parameter and performing the second processing according to an adjusted second parameter.

4. The substrate processing method of claim 3, further comprising:

generating, before the adjusting of the first parameter and the second parameter, estimation information in which a line width distribution on the surface of the substrate after being subjected to the development is predicted, wherein the generating of the estimation information comprises:

acquiring information indicating multiple test conditions in which at least one of the first parameter or the second parameter has different values;

performing a test developing processing corresponding to the developing processing on a test substrate for each of the multiple test conditions;

acquiring, for each of the multiple test conditions, measurement data of the line width distribution on a surface of the test substrate after being subjected to the development; and generating, for each of multiple positions on the surface of the test substrate, a regression equation indicating a relationship between the first parameter and the second parameter and a line width based on the measurement data, and wherein the adjusting of the first parameter and the second parameter comprises calculating, based on the regression equation, a set value of the first parameter and a set value of the second parameter at a time of performing the developing processing such that the line width distribution on the surface of the substrate after being subjected to the development satisfies a predetermined condition.

5. The substrate processing method of claim 4, wherein the calculating of the set value of the first parameter and the set value of the second parameter based on the regression equation comprises:

calculating, based on the regression equation, prediction data of the line width distribution after the development for each combination of multiple stages when changing each of the first parameter and the second parameter in the multiple stages; and acquiring, in the prediction data, a value of the first parameter and a value of the second parameter in a combination, in which a highest uniformity of the line width distribution is obtained, as the set value of the first parameter and the set value of the second parameter.

6. The substrate processing method of claim 4, wherein the generating of the regression equation comprises generating the regression equation by performing ridge regression analysis based on the measurement data and respective values of the first parameter and the second parameter under which the measurement data is obtained.

7. The substrate processing method of claim 3, wherein the developing processing comprises supplying a rinse liquid on the surface of the substrate after the maintaining of the liquid film of the developing liquid, and the adjusting of the first parameter and the second parameter comprises adjusting the first parameter and the second parameter without changing a condition that determines a period of time ranging from a start time of the supplying of the developing liquid to a start time of the supplying of the rinse liquid.

8. The substrate processing method of claim 3, wherein the first parameter is a processing time of the first processing.

9. The substrate processing method of claim 3, wherein the second parameter is a start timing of the second processing in the developing processing.

* * * * *